United States Patent
Ren et al.

(10) Patent No.: US 10,323,305 B2
(45) Date of Patent: Jun. 18, 2019

(54) THERMOELECTRIC COMPOSITIONS AND METHODS OF FABRICATING HIGH THERMOELECTRIC PERFORMANCE MGAGSB-BASED MATERIALS

(71) Applicant: University of Houston System, Houston, TX (US)

(72) Inventors: Zhifeng Ren, Houston, TX (US); Huaizhou Zhao, Beijing (CN); Zhongjia Tang, Houston, TX (US); Jiehe Sui, Harbin (CN); Yucheng Lan, Houston, TX (US); Qing Jie, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 350 days.

(21) Appl. No.: 14/624,007

(22) Filed: Feb. 17, 2015

(65) Prior Publication Data
US 2016/0326615 A1 Nov. 10, 2016

Related U.S. Application Data

(60) Provisional application No. 61/940,909, filed on Feb. 18, 2014.

(51) Int. Cl.
*C22C 12/00* (2006.01)
*H01L 35/18* (2006.01)
(Continued)

(52) U.S. Cl.
CPC .......... *C22C 23/00* (2013.01); *B22F 1/0003* (2013.01); *B22F 3/15* (2013.01); *B22F 9/04* (2013.01); *C22C 1/0408* (2013.01); *C22C 12/00* (2013.01); *C22C 30/00* (2013.01); *H01L 35/14* (2013.01); *H01L 35/18* (2013.01); *H01L 35/34* (2013.01); *B22F 2009/043* (2013.01); *B22F 2301/058* (2013.01); *B22F 2998/10* (2013.01)

(58) Field of Classification Search
CPC .......... C22C 1/0408; C22C 5/06; C22C 12/00; B22F 2301/058
See application file for complete search history.

(56) References Cited

U.S. PATENT DOCUMENTS 3,782,927 A * 1/1974 Nicolaou ............... H01L 35/20
136/239
2008/0060693 A1* 3/2008 Sterzel ................... H01L 35/08
136/203
(Continued)

FOREIGN PATENT DOCUMENTS

CN 103215466 A 7/2013
JP 2007116156 A 5/2007

OTHER PUBLICATIONS

PCT/US2015/016130 International Search Report and Written Opinion dated May 19, 2015 (14 p.).

*Primary Examiner* — Scott R Kastler
*Assistant Examiner* — Vanessa T. Luk
(74) *Attorney, Agent, or Firm* — Conley Rose, P.C.

(57) ABSTRACT

Systems and methods of manufacturing a thermoelectric, high performance material by using ball-milling and hot pressing materials according to various formulas, where some formulas substitute a different element for part of one of the elements in the formula, in order to obtain a figure of merit (ZT) suitable for thermoelectric applications.

7 Claims, 34 Drawing Sheets

(51) Int. Cl.
*C22C 30/00* (2006.01)
*C22C 23/00* (2006.01)
*B22F 3/15* (2006.01)
*H01L 35/14* (2006.01)
*H01L 35/34* (2006.01)
*B22F 1/00* (2006.01)
*B22F 9/04* (2006.01)
*C22C 1/04* (2006.01)

(56) References Cited

U.S. PATENT DOCUMENTS

| | | |
|---|---|---|
| 2009/0211619 A1 | 8/2009 | Sharp et al. |
| 2011/0248209 A1* | 10/2011 | Androulakis ......... C01B 19/002 |
| | | 252/71 |
| 2012/0091404 A1 | 4/2012 | Snyder et al. |
| 2012/0248386 A1 | 10/2012 | Heremans et al. |
| 2012/0298924 A1* | 11/2012 | Banerjee ................ B82Y 40/00 |
| | | 252/500 |
| 2013/0001480 A1* | 1/2013 | Malik ....................... B22F 3/14 |
| | | 252/519.4 |

* cited by examiner

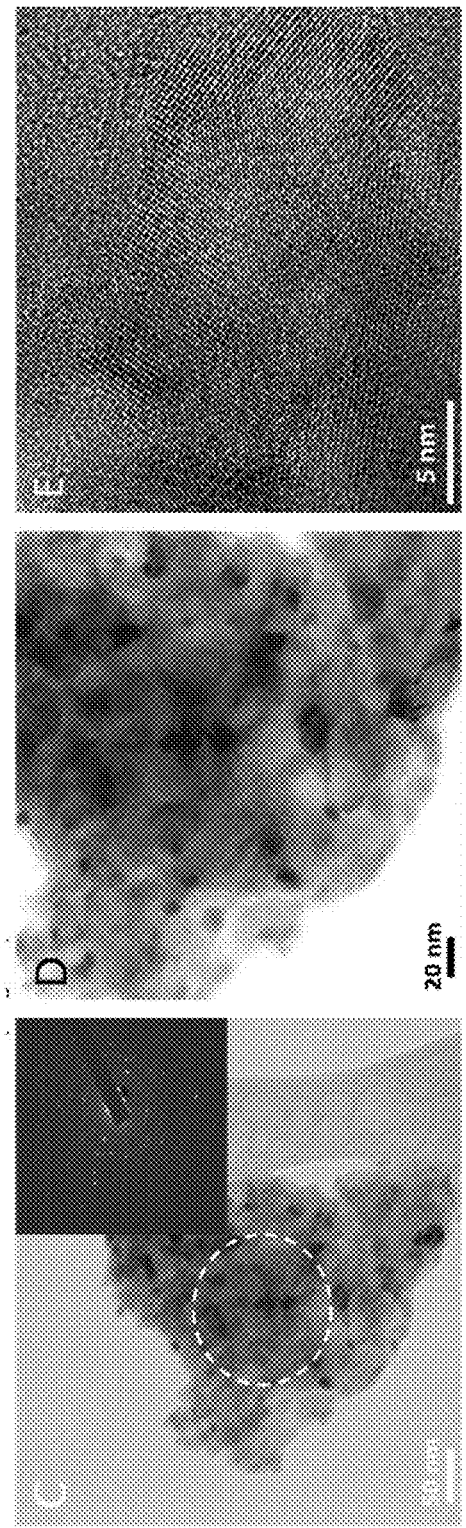

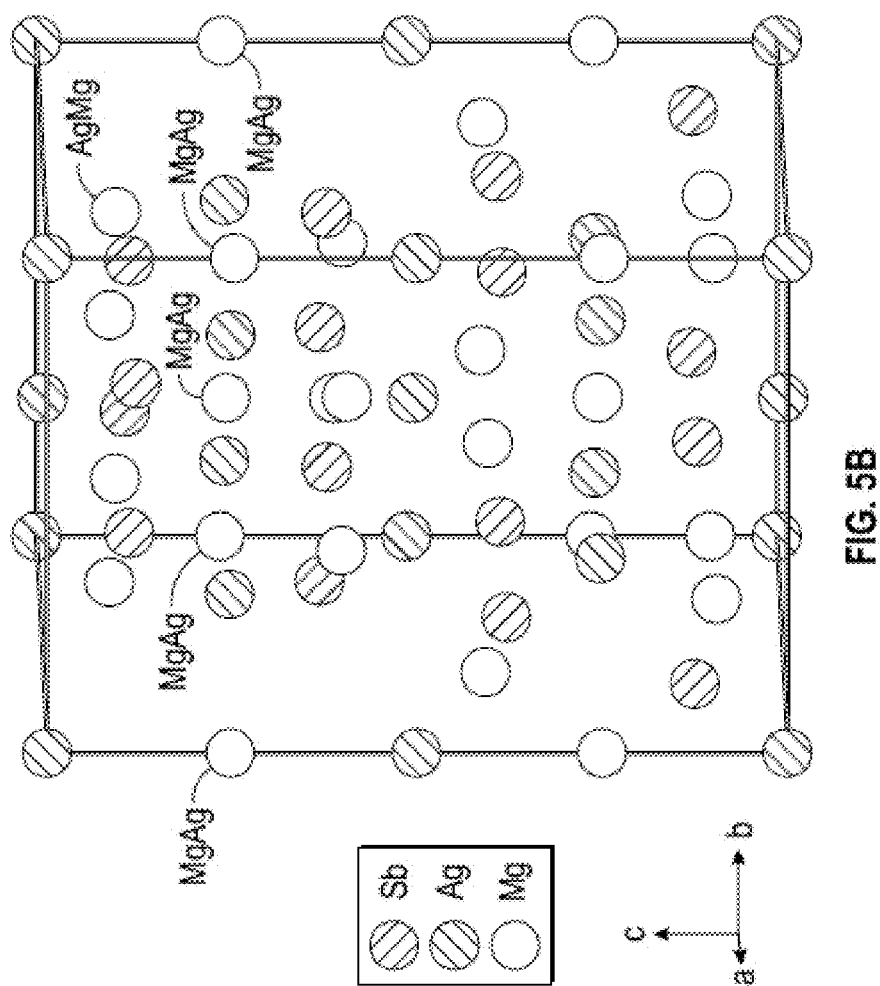

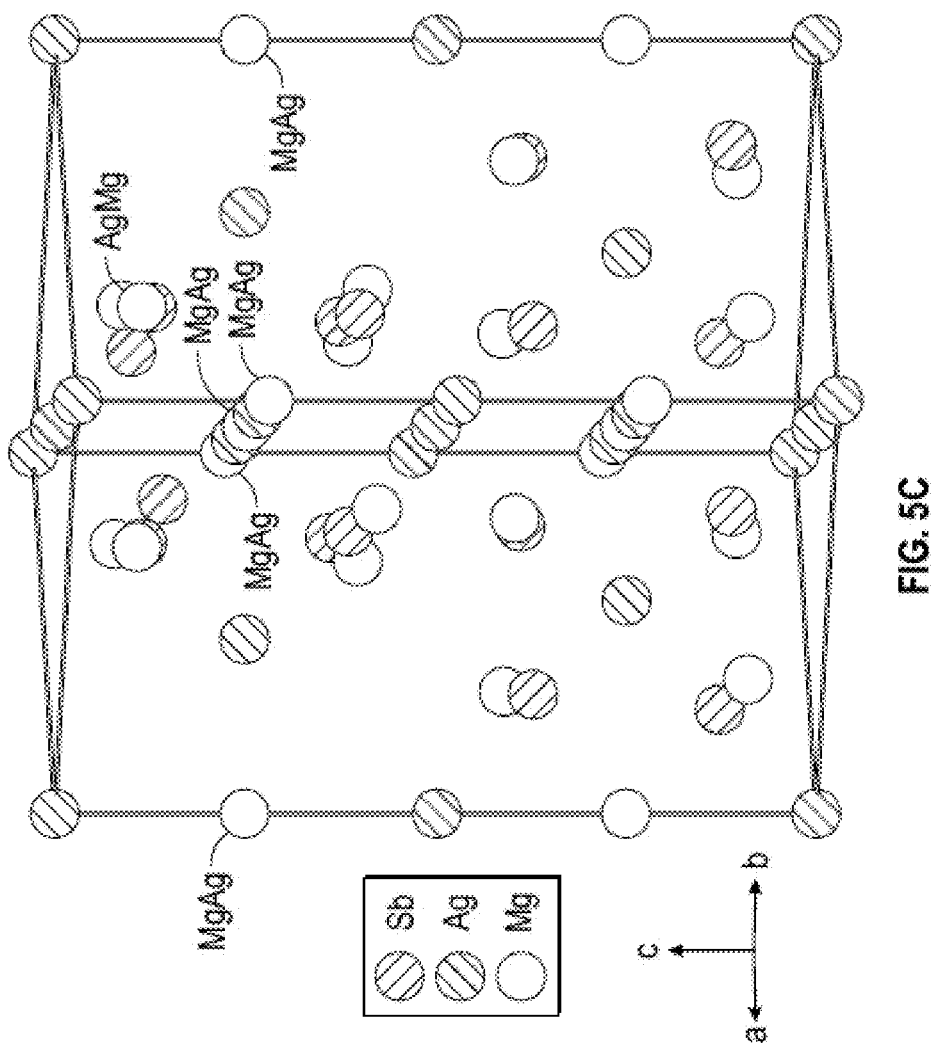

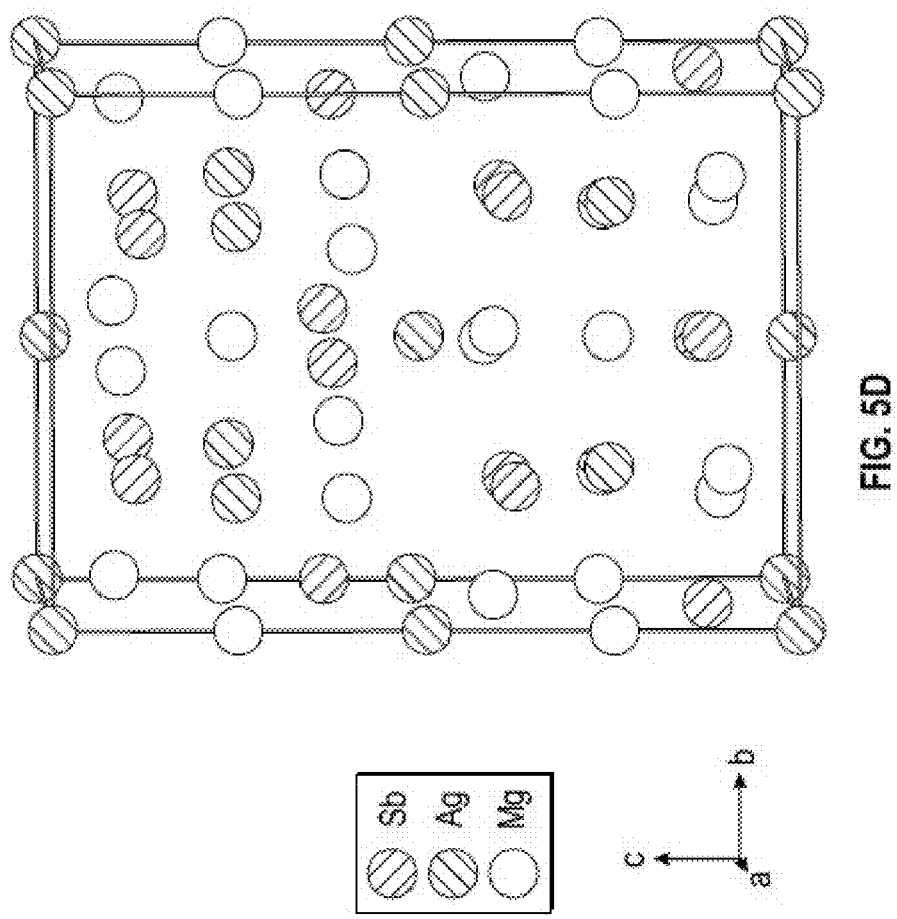

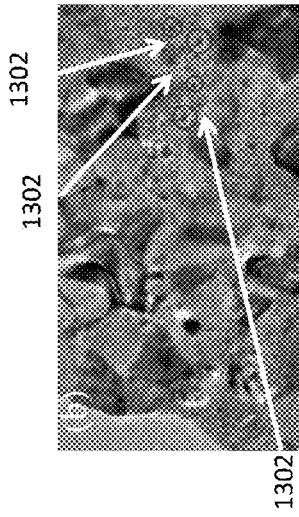
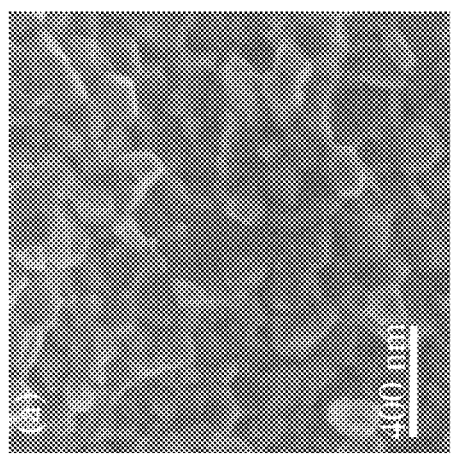
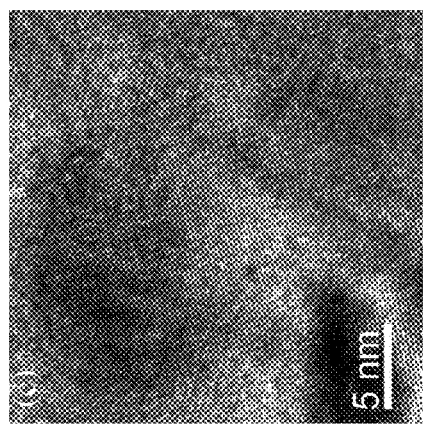
FIG. 13B
FIG. 13A
FIG. 13C

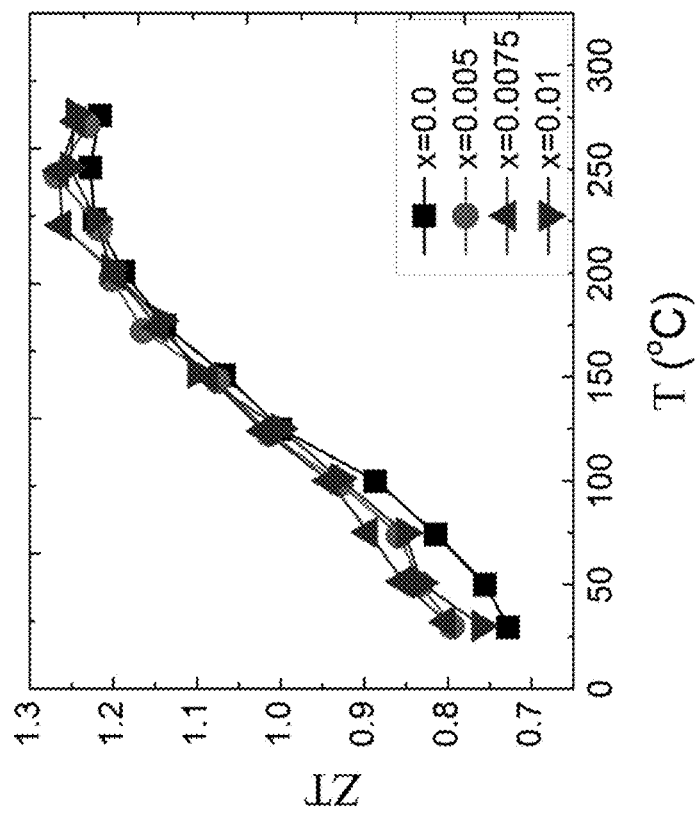

US 10,323,305 B2

THERMOELECTRIC COMPOSITIONS AND METHODS OF FABRICATING HIGH THERMOELECTRIC PERFORMANCE MGAGSB-BASED MATERIALS

CROSS-REFERENCE TO RELATED APPLICATIONS

This application claims priority to and incorporates in its entirety U.S. Provisional Patent App. No. 61/940,909, "Systems and Methods of Fabrication of High Thermoelectric Performance MgAgSb-Based Materials," filed Feb. 18, 2014.

RESEARCH OR DEVELOPMENT

United States Air Force Office of Scientific Research under contract number FA9550-10-1-0533, and the United States Department of Energy under contract numbers DE-SC0010831, DE-FG02-13ER46917 and DE-SC0001299.

BACKGROUND

Background of the Technology

Over the past decades, thermoelectric materials have been extensively studied for potentially broad applications in refrigeration, waste heat recovery, solar energy conversion, etc. The efficiency of thermoelectric devices is governed by the materials' dimensionless figure of merit $ZT=(S^2\sigma/\kappa)T$, where S, $\sigma$, T, and $\kappa$ are the Seebeck coefficient, electrical conductivity, absolute temperature, and thermal conductivity, respectively. The thermoelectric performance of materials such as PbTe, PbSe, skutterudites, SiGe alloys, half-Heuslers, $Bi_2Te_3$ and its alloys may be employed near room temperature for applications in cooling and low temperature waste heat recovery.

BRIEF SUMMARY OF THE DISCLOSURE

In an embodiment, a method of manufacturing a thermoelectric material comprising: ball-milling a plurality of components to form at least one powder; forming a pressed component by hot-pressing the at least one powder; and annealing the pressed component, wherein the pressed component comprises a ZT value of at least 0.85 at room temperature.

A thermoelectric material comprising:
a thermoelectric material according to the formula $X_{1-n}A_nY_{1-m}B_mZ_{1-q}C_q$ wherein X, Y, and Z are each one of magnesium (Mg), silver (Ag), and antimony (Sb), and wherein the ZT of the thermoelectric material is about 0.5 to about 2 at room temperature.

A method of manufacturing a thermoelectric material comprising:
forming a first mixture by ball-milling a first component and a second component for a period from about 10 minutes to about 50 hours;
disposing a third component in the first mixture;
forming a second mixture by ball-milling the third component and the first mixture for a period from about 10 minutes to about 50 hours;
disposing a fourth component into the second mixture;
forming a third mixture by ball-milling the fourth component and the second mixture for a period from about 10 minutes to about 50 hours;
forming a pressed component by hot-pressing the third mixture; and
wherein the thermoelectric material comprises a ZT of at least 0.75 at room temperature.

A thermoelectric material comprising:
a thermoelectric material according to the composition $Mg_{1-x}Na_xAg_ySb_z$, wherein x is from about to 0.005 about 0.01.

A thermoelectric material comprising:
a plurality of components according to the composition $Mg_wAg_{y-x}Cu_xSb_{0z}$ wherein x is from about to 0.005 about 0.01.

Embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings.

BRIEF DESCRIPTION OF THE DRAWINGS

For a detailed description of the exemplary embodiments disclosed herein, reference will now be made to the accompanying drawings in which:

FIGS. 3A-3E illustrate the resulting XRD patterns, structure, and characteristics of $MgAg_{0.97}Sb_{0.99}$ and $MgAg_{0.965}Ni_{0.005}Sb_{0.99}$ samples.

FIGS. 5B-5D illustrate lattice structures for $MgAg_{0.97}Sb_{0.99}$ viewed from different angles.

FIG. 13A illustrates an SEM image of thermoelectric materials fabricated according to certain embodiments of the present disclosure.

FIG. 13B is a low-resolution TEM image of a sample of $Mg_{0.9925}Na_{0.0075}Ag_{0.97}Sb_{0.99}$, fabricated according to certain embodiments of the present disclosure.

FIG. 13C is a high resolution TEM image of a sample of $Mg_{0.9925}Na_{0.0075}Ag_{0.97}Sb_{0.99}$, fabricated according to certain embodiments of the present disclosure.

FIG. 14 illustrates the temperature dependent ZT for $Mg_{1-x}Na_xAg_{0.97}Sb_{0.99}$ (x=0, 0.005, 0.0075, and 0.01) fabricated according to certain embodiments of the present disclosure.

DETAILED DESCRIPTION OF THE DISCLOSED EXEMPLARY EMBODIMENTS

Figure 1:
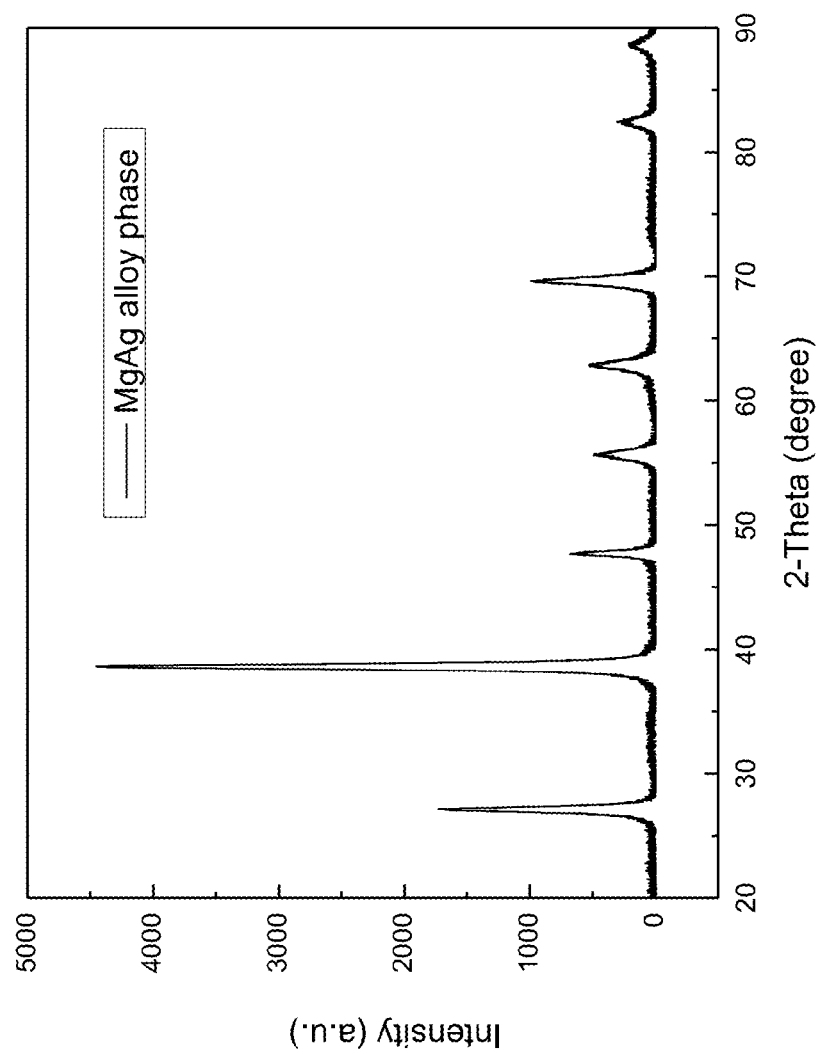
FIG. 1 is an XRD pattern of the powdered MgAg sample fabricated by ball milling and hot pressing.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

Conventionally, $Bi_2Te_3$ and its alloys are the materials typically used near room temperature for cooling and low temperature waste heat recovery applications. That alloy family has been commercialized on a large scale for cooling applications and other applications that benefit from materials with desirable thermoelectric properties such as low thermal conductivity and a thermoelectric figure of merit close to 1. As used herein, the term "room temperature" is a temperature from about 59° F. to about 77° F. (15° to 25° C.).

A plurality of MgAgSb samples were fabricated and doped with nickel (Ni), copper (Cu), and sodium (Na), respectively, in various embodiments as discussed herein, including systems and methods for the fabrication of nanostructured p-type MgAgSb with figure of merit (ZT) values comparable to that of the conventionally employed p-type nanostructured $Bi_{0.4}Sb_{1.6}Te_3$.

Ni-Doped MgAgSb

In an embodiment, a first material was fabricated according to the formula MgAgSb, a second material was fabricated according to the formula $MgAg_{0.97}Sb_{0.99}$, and a third material was fabricated according to the formula $MgAg_{0.965}Ni_{0.005}Sb_{0.99}$. The properties discussed above and herein result at least in part from the dense bulk material consisting of grains that may have a maximum diameter smaller than 200 nm. Two examples of the materials fabricated according to certain embodiments of the present disclosure are MgAgSb-based materials $MgAg_{0.97}Sb_{0.99}$ and $MgAg_{0.965}Ni_{0.0005}Sb_{0.99}$. At room temperature, there was low thermal conductivity of about 0.7 W m$^{-1}$ K$^{-1}$ and the ZT values were close to 1, which increased with increasing temperature to reach about 1.4 at 475 K.

Pure phase materials were obtained when the composition is slightly Ag and Sb deficient, e.g., $Mg_xAg_{x-y}Sb_{x-z}$, where y and z may be the same or may be different, and may be greater than or equal to 0.90. In one example, pure phase materials were obtained using a composition according to the formula: $MgAg_{0.97}Sb_{0.99}$. In an embodiment, these pure phase materials may be fabricated through a multi-step ball milling and hot pressing method which may, in some embodiments, be followed by an annealing. The grains in the sample fabricated according to embodiments of the present disclosure may have a maximum diameter smaller than 20 nm, and may have been formed by a pressing temperature of 400 K-650 K, may be smaller grains than those in other thermoelectric materials made by the same method. Because of the higher power factor achieved from the higher phase purity, and lower thermal conductivity due to the point defects of vacancies and antisites, a ZT of about 0.7 at 300 K and about 1.2 at 450 K for $MgAg_{0.97}Sb_{0.99}$ were achieved. By further alloying the Ag site using a very small amount of Ni according to a formula of $Mg_xNi_{x-y}Ag_{x-z}Sb_{x-w}$, where y, z, and w may be the same or different, and may be zero. In one embodiment, using a sample fabricated according to certain embodiments of the present disclosure according to the formula $MgAg_{0.965}Ni_{0.005}Sb_{0.99}$, a ZT of about 1 at 325 K and about 1.4 at 450 K was obtained.

FIG. 1 is an x-ray diffraction (XRD) spectrum of a MgAg sample fabricated by ball-milling and hot pressing according to certain embodiments of the present disclosure. In an embodiment, a two-step ball milling process was combined with hot pressing to synthesize the material. First, magnesium (Mg) and silver (Ag) were loaded into a ball mill, ball-milled, and then antimony was added to the ball milled mixture. The Mg—Ag—Sb combination was then ball milled in a second ball milling step. Subsequent to the second ball-milling step, the powder may be hot pressed into a disc or other form and the hot-pressed disc may be annealed. FIG. 1 illustrates the XRD pattern for the MgAg intermediate alloy phase obtained by the reaction between Mg and Ag metal elements through ball milling process, the space group belonging to Pm3m (221). In some embodiments, the intermediate alloy phase may be formed by ball-milling, and in alternate embodiments the intermediate phase may be formed by ball-milling and subsequent hot-pressing and/or annealing.

In one embodiment, 0.8102 g magnesium (Mg, Sigma Aldrich, 99.8% metal basis) and 3.5956 g silver (Ag, Sigma Aldrich, 99.9% metal basis) metal pieces (Mg:Ag=1:1) were loaded into a stainless steel jar with balls inside the argon-filled glove box, and ball-milled for 8 hours leading to formation of the MgAg phase. It is appreciated that, while gram measurements are utilized in this example, the ratio of Mg to Ag may be 1:1, or may be so that the concentration of Mg is within +/−5% of the concentration in Ag. The ratio may be utilized to determine the appropriate weights of each component. Following this step, 4.0587 g of antimony (Sb, Sigma Aldrich, 99.8% metal basis) chunks were added into the jar inside the glove box and ball-milled for about five hours with the ball-milled MgAg powder. The final powder was hot pressed under DC current at 575 K for 8 minutes.

Figure 2:
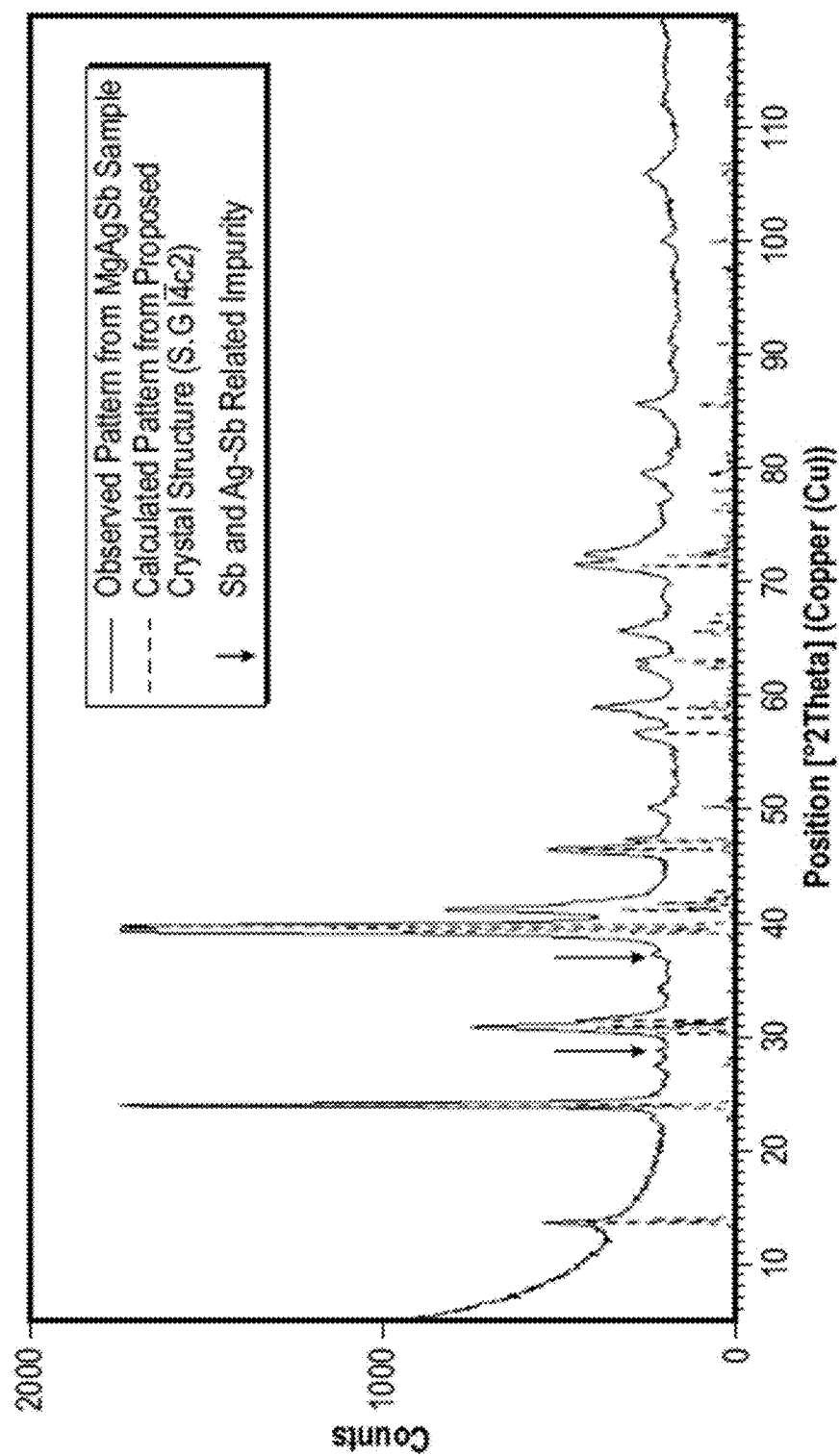
FIG. 2 is an illustration of an x-ray diffraction pattern of the sample MgAgSb fabricated according to a two-step ball-milling process.

FIG. 2 is an illustration of an x-ray diffraction pattern of MgAgSb which is fabricated by first forming the Mg—Ag ball-milled compound and then by adding Sb and ball-milling it with the Mg—Ag compound to form a second compound. FIG. 2 illustrates impurity phases (marked by the arrows) based on the proposed structure (S.G. $I\bar{4}c2$). The as-pressed disc was then annealed at 575 K in air for 30 minutes prior to using the sample to take structure characterizations and property measurements. Some impurity phase peaks were found in the XRD spectrum of MgAgSb (collected on an X'Pert PRO PAN analytical diffractometer with Cu Kα radiation source). The phase analysis based on the proposed space group $I\bar{4}c2$ led to the identification of possible Sb and Ag—Sb related impurity phases in the initially stoichiometric MgAgSb sample. In an embodiment, in order to eliminate the impurities and obtain pure phase samples, some of the Ag and/or Sb content was removed, for example, according to the formula $MgAg_{0.97}Sb_{0.99}$, which yielded phase pure samples.

Based on the phase pure composition $MgAg_{0.97}Sb_{0.99}$, and as discussed in detail below, further substitution was made for Mg, Ag, and Sb. In some embodiments, at least some of the silver (Ag) may be replaced with at least one of nickel (Ni), copper (Cu), zinc (Zn), gold (Au), titanium (Ti), vanadium (V), chromium (Cr), manganese (Mn), iron (Fe), cobalt (Co), and alloys and combinations thereof. In alternate embodiments, at least some of the magnesium (Mg) may be replaced by at least one of sodium (Na), potassium (K), rubidium (Rb), calcium (Ca), strontium (Sr), barium (Ba), yttrium (Y), lanthanum (La), or any element from the lanthanoid group, and alloys and combinations thereof. In still other embodiments, at least some of the antimony (Sb) may be replaced by one of aluminum (Al), gallium (Ga), indium (In), thallium (Tl), silicon (Si), germanium (Ge), tin (Sn), lead (Pb), arsenic (As), bismuth (Bi), selenium (Se), and tellurium (Te), and alloys and combinations thereof. It is understood that the substitutions for Ag, Mg, and Sb may be made with the same elements or combination of elements or with different elements and combinations thereof.

The Ni-substituted sample was fabricated according to the formula $MgAg_{0.965}Ni_{0.005}Sb_{0.99}$ and yielded excellent thermoelectric properties as detailed in FIGS. 3A-3E and discussed below. While in the example discussed herein, part of the Ag and Sb content was substituted with Ni, while in other embodiments a portion of the Mg and/or Ag and Sb contents may be removed and replaced with nickel (Ni), copper (Cu), chromium (Cr), zinc (Zn), etc. The densities of disc samples fabricated with Ni and measured by the Archimedes method were 6.21, 6.17, and 6.20 g cm$^{-3}$ for MgAgSb, $MgAg_{0.97}Sb_{0.99}$, and $MgAg_{0.965}Ni_{0.005}Sb_{0.99}$, respectively, about 99% of the theoretical density.

Figure 3B:
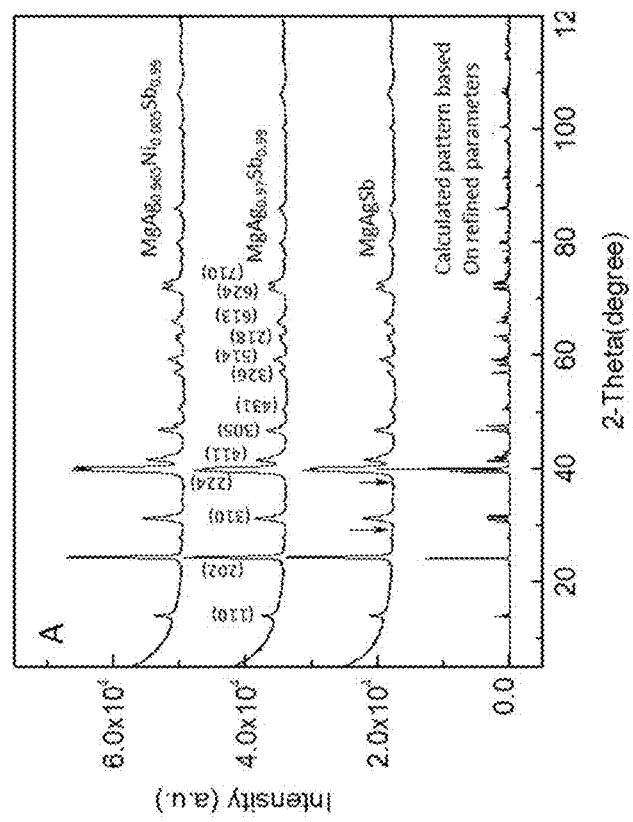
Figure 3A:
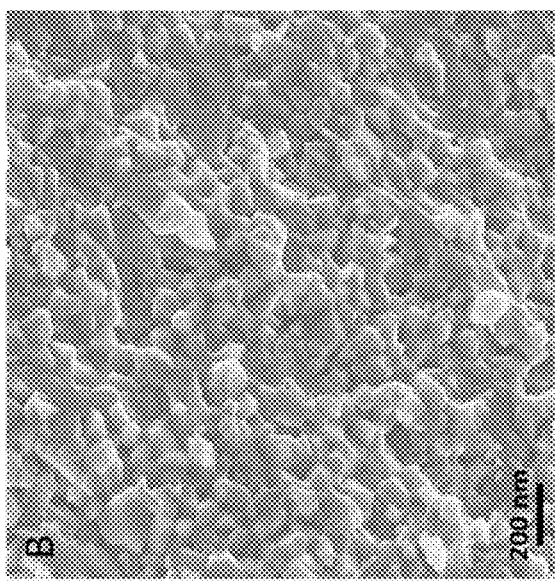

FIGS. 3A-3E illustrate the resulting structure and characteristics of $MgAg_{0.97}Sb_{0.99}$ and $MgAg_{0.965}Ni_{0.005}Sb_{0.99}$ samples. FIG. 3A is an XRD (X-ray diffraction) patterns for MgAgSb and $MgAg_{0.97}Sb_{0.99}$, and Ni substituted $MgAg_{0.965}Ni_{0.005}Sb_{0.99}$ samples: impurity peaks are indicated by arrows, and the calculated XRD pattern is shown at the bottom for comparison.

Figure 4:
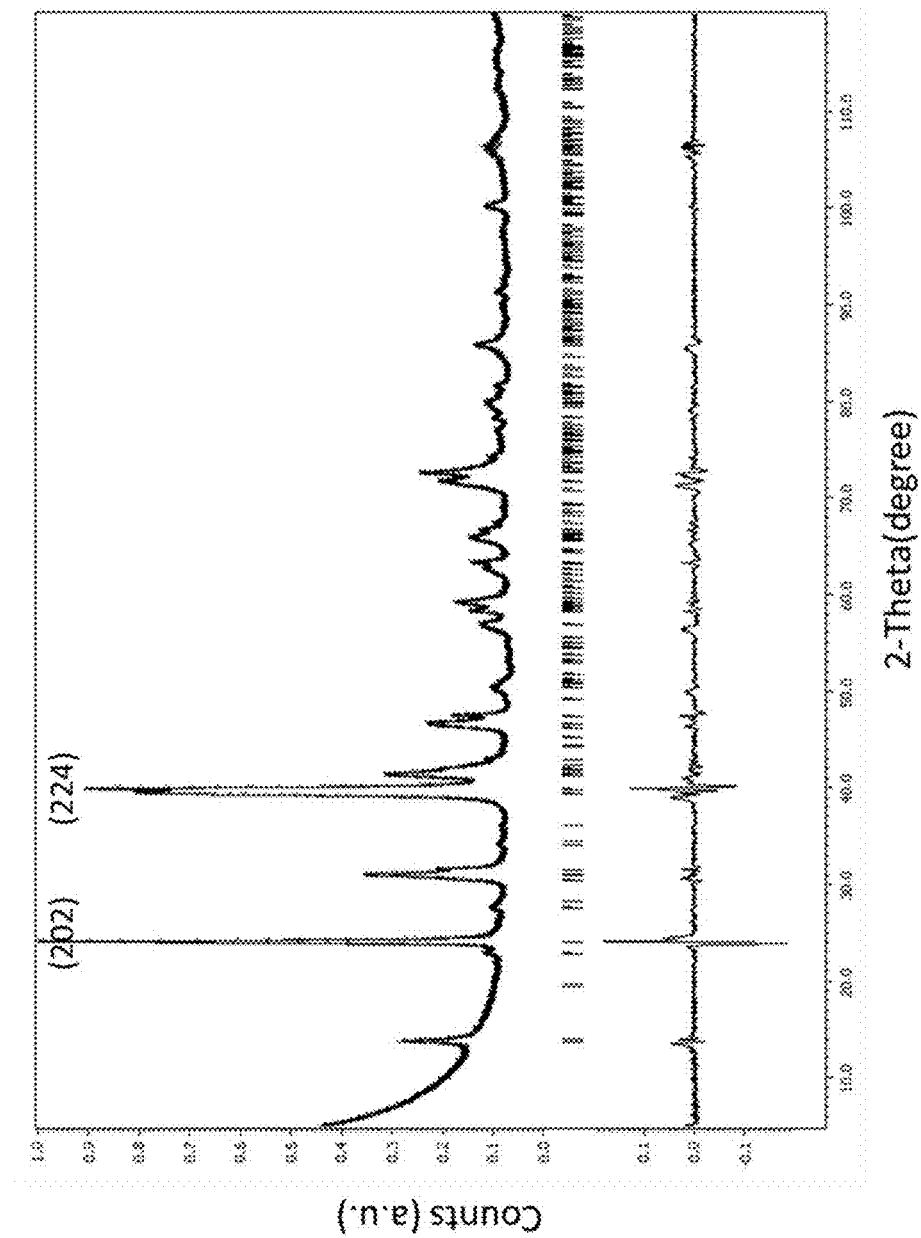
FIG. 4 is an illustration of profile refinement of the x-ray diffraction pattern of a sample of $MgAg_{0.97}Sb_{0.99}$.

FIG. 4 is an illustration of profile refinement of the x-ray diffraction pattern of a sample of $MgAg_{0.97}Sb_{0.99}$ fabricated according to certain embodiments of the present disclosure. The profile refinement for the XRD pattern in FIG. 4 of sample $MgAg_{0.97}Sb_{0.99}$ indicates the following: Rp=3.82%, wRp=6.46%, a=b=9.1585(1) Å, C=12.6665(4) Å, volume=1062.45(3) Å$^3$, density=6.256(4) gcm$^{-3}$. The refined parameters in FIG. 4 were then used to build the calculated XRD pattern as shown at the bottom of FIG. 2.

FIG. 3B is an SEM image of a freshly broken surface of disc sample $MgAg_{0.97}Sb_{0.99}$. SEM (FIGS. 3A and 3B) and TEM (FIGS. 3C and 3D) images were taken for samples of $MgAg_{0.97}Sb_{0.99}$. FIG. 3B shows the SEM image of a freshly broken surface of $MgAg_{0.97}Sb_{0.99}$. The grain sizes are in the range of about 100 nm to about 200 nm with a fairly good uniformity and appear densely packed, which is consistent with its high relative density as indicated above. TEM images were obtained for confirmation of grain size, and are shown in FIGS. 3C-3E.

TEM images were taken on the same sample of $MgAg_{0.97}Sb_{0.99}$ and shown in FIG. 3C-3E. FIG. 3C is a low magnification TEM image. The selected area indicated by the dotted circle reflects where the inset electron diffraction pattern of the sample of $MgAg_{0.97}Sb_{0.99}$ was obtained. FIG. 3C is a high resolution, low magnification TEM image. FIG. 3D is a high resolution, medium magnification (greater than the magnification in FIG. 3C) TEM image of $MgAg_{0.97}Sb_{0.99}$. The images in FIGS. 3C-3D illustrate that the grains are in the range of 10-20 nm and are much smaller than what was shown by the SEM image in FIG. 3B, indicating that FIG. 3B may illustrate both agglomerations and individual grains or nano-crystallites. The size was confirmed by the selected area electron diffraction as shown in the inset of FIG. 3C. A high resolution TEM image as shown in FIG. 3E further demonstrates that the large grains in FIG. 3B are composed of much smaller grains or nano-crystallites of about 5 nm to about 10 nm with consistent (good) crystallization.

Figure 5A:
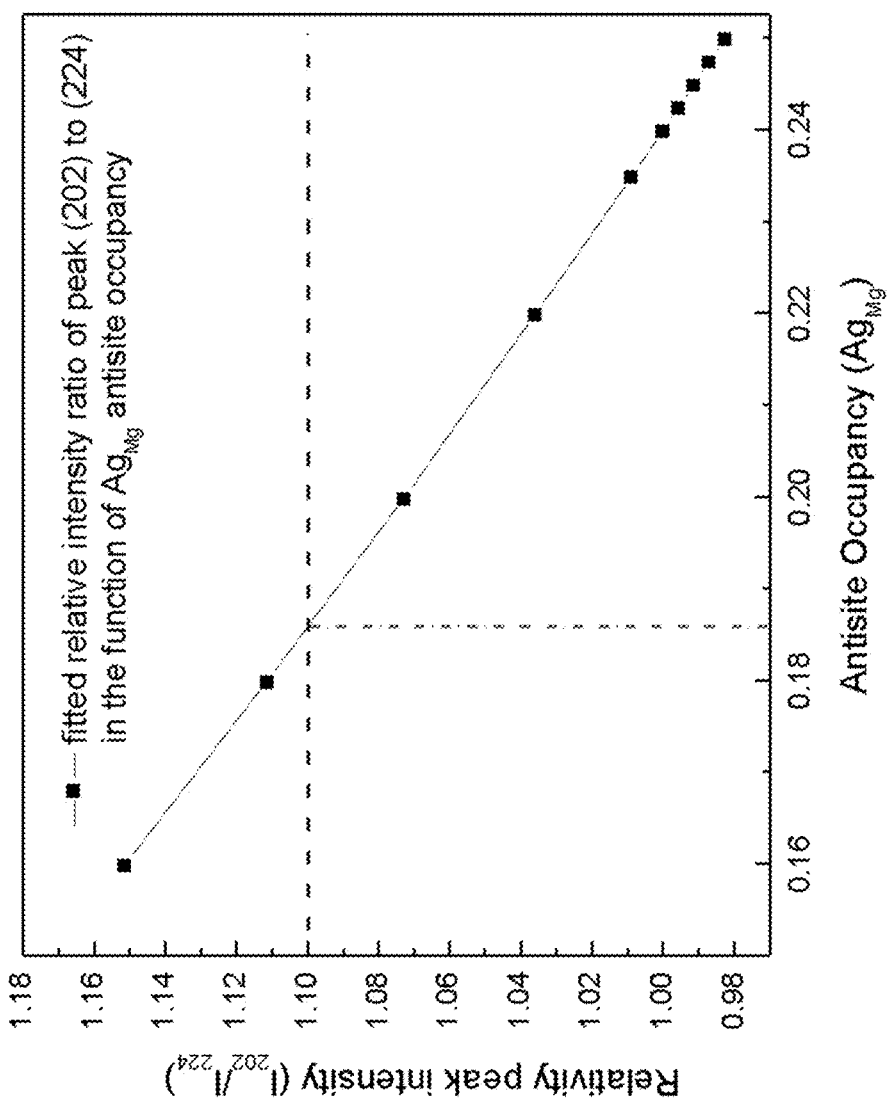
FIG. 5A illustrates the relative X-ray diffraction peak intensity of (202)/(224) as a function of Ag into Mg site in $MgAg_{0.97}Sb_{0.99}$.

FIG. 5A is an x-ray diffraction (XRD) pattern that illustrates the relative x-ray diffraction peak intensity of $MgAg_{0.97}Sb_{0.99}$. During the XRD pattern modeling, antisites between Ag and Mg may form in the structure. In addition, the antisite occupation between Mg and Ag may be possible in the MgAgSb system. Fittings on the influence of antisite occupancy between Mg and Ag atoms to the relative XRD peak intensity of the (202) and (224) planes are shown in FIG. 5A. The possible antisite occupancy in the unit cell is also shown in FIG. 5A. The fitted value of Ag on Mg antisite occupancy in MgAg$_{0.97}$Sb$_{0.99}$ is 0.185. The synthesis of single phase from composition MgAg$_{0.97}$Sb$_{0.99}$ by a two-step ball milling and hot pressing process is illustrated here, but may also be a method of synthesizing additional alloy systems such as alloy systems that are Ta, Eu, Ho, Sc, Ca, Hf, Mg, La, Ce, Yb, and Ti-based including TaCoSn, EuCuSi, HoAgSi, ScAgSi, EuNiSb, CaAgBi, HfCoBi, MgAgBi, LaNiBi, CeNiBi, YbNiBi, TiCoBi, etc.

Figures 6A, 6B, 6C, 6D:
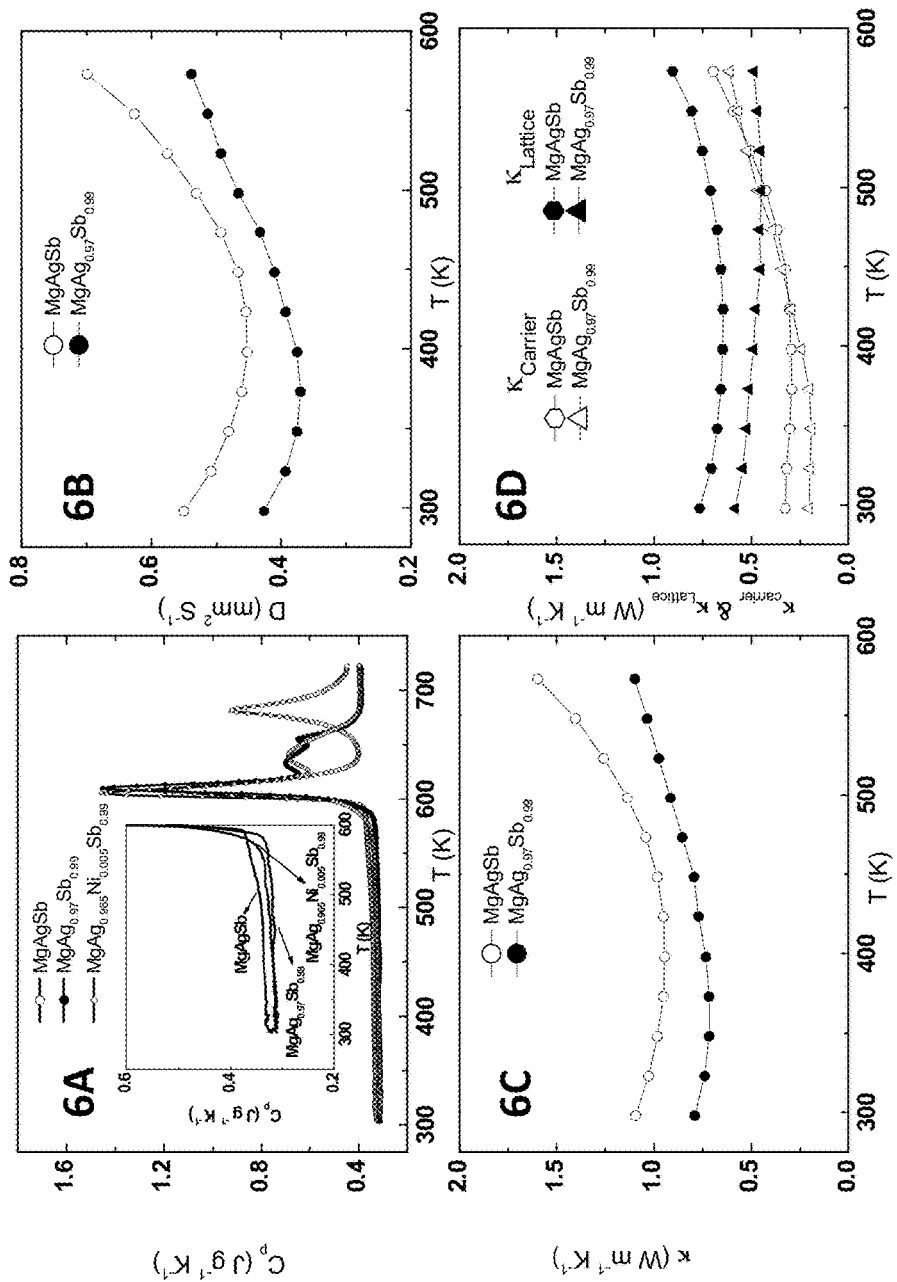
FIGS. 6A-6H illustrate thermal property measurements and electrical transport property measurements for samples fabricated according to certain embodiments of the present disclosure.

FIGS. 5B-5D illustrate a plurality of lattice structures for MgAg$_{0.97}$Sb$_{0.99}$. FIG. 5B illustrates the crystal structure, that is, the position of the atoms in the tetragonal structure. FIG. 5C illustrates the view along the [110] direction, and FIG. 5D illustrates the view along the [100] direction. The unit cell structure of MgAg$_{0.97}$Sb$_{0.99}$ looking from different orientations is shown in FIGS. 5B-5D. The crystal structure is tetragonal, with a space group of $\bar{I}4c2$. The possible positions of antisite were pointed out based on the structure refinement using the Rietveld method. In some embodiments, about 25% of Mg positions can be occupied by Ag, but in alternate embodiments, about 18.5% of Mg sites are occupied by Ag, and the Ag atoms in the (4a) positions in the structure are occupied by Mg. The Mg goes to the Ag(4a) positions, that is, Ag atoms in the (4a) positions in the structure are now instead occupied by Mg atoms FIGS. 6A-6H illustrate thermal property measurements and electrical transport property measurements for samples fabricated according to certain embodiments of the present disclosure. Thermal property measurements including specific heat ($C_p$), diffusivity (D), and electrical transport properties were performed on all samples. FIG. 6A illustrates $C_p$ values of the three compositions (MgAgSb, MgAg$_{0.97}$Sb$_{0.99}$, MgAg$_{0.965}$Ni$_{0.0005}$Sb$_{0.99}$. All the property measurements in FIGS. 6A-6D were carried out below the phase transition temperature at 610 K. The temperature dependent $C_p$ is shown in FIG. 6A which illustrates two phase transitions at about 610K and at about 682K for the stoichiometric sample, corresponding to the α phase below about 610K, the intermediate β phase between about 610K and about 682K, and the γ phase above about 682K. It is noted that both the MgAg$_{0.97}$Sb$_{0.99}$ and the Ni-substituted MgAg$_{0.965}$Ni$_{0.005}$Ag$_{0.99}$ samples have lower second phase transition temperatures. The inset in FIG. 6A shows the enlarged $C_p$ curve of the low temperature range. The MgAgSb sample had slightly higher $C_p$ values (0.34 J g$^{-1}$ K$^{-1}$ at 550 K) than those of MgAg$_{0.97}$Sb$_{0.99}$ and MgAg$_{0.965}$Ni$_{0.005}$Ag$_{0.99}$, which were both in the range of about 0.30 J g$^{-1}$ K$^{-1}$ to about 0.32 J g$^{-1}$ K$^{-1}$. The $C_p$ curve of MgAg$_{0.965}$Ni$_{0.005}$Ag$_{0.99}$ is slightly higher than that of MgAg$_{0.97}$Sb$_{0.99}$ above about 450 K. Thermal conductivity was then calculated based on K=D$\rho c_p$ where $\rho$ is the measured density of the samples.

FIG. 6B illustrates the thermal diffusivity of MgAgSb and MgAg$_{0.97}$Sb$_{0.99}$ and FIG. 6C illustrates the thermal conductivities of MgAgSb and MgAg$_{0.97}$Sb$_{0.99}$. The carrier and lattice contributions to the thermal conductivity are calculated based on the Wiedemann-Franz law $K_{total}=K_{carrier}+K_{lattice}$, and $K_{carrier}=L\sigma T$, where $\sigma$ is the electrical conductivity and T the absolute temperature, and L the Lorenz number.

FIG. 6D shows the temperature dependence of $\kappa_{carrier}$ and $k_{lattice}$ for both MgAg$_{0.97}$Sb$_{0.99}$ and MgAgSb. Turning back to FIG. 6D, the sample of MgAg$_{0.97}$Sb$_{0.99}$ has lower thermal conductivity over the whole temperature range. This can be ascribed to the strong phonon scattering due to the deficiencies at both the Ag and Sb sites and the very small grain size. FIG. 6D illustrates the lattice thermal conductivity $\kappa_K$ of MgAg$_{0.97}$Sb$_{0.99}$ is about 0.6 W m$^{-1}$ K$^{-1}$ at 300 K, and about 0.5 W m$^{-1}$ K$^{-1}$ at 570 K, and that, due to the impurity phases in the MgAgSb sample, a higher thermal conductivity of about 0.8 W m$^{-1}$ K$^{-1}$ at 300 K was observed.

Figures 6E, 6F, 6G, 6H:
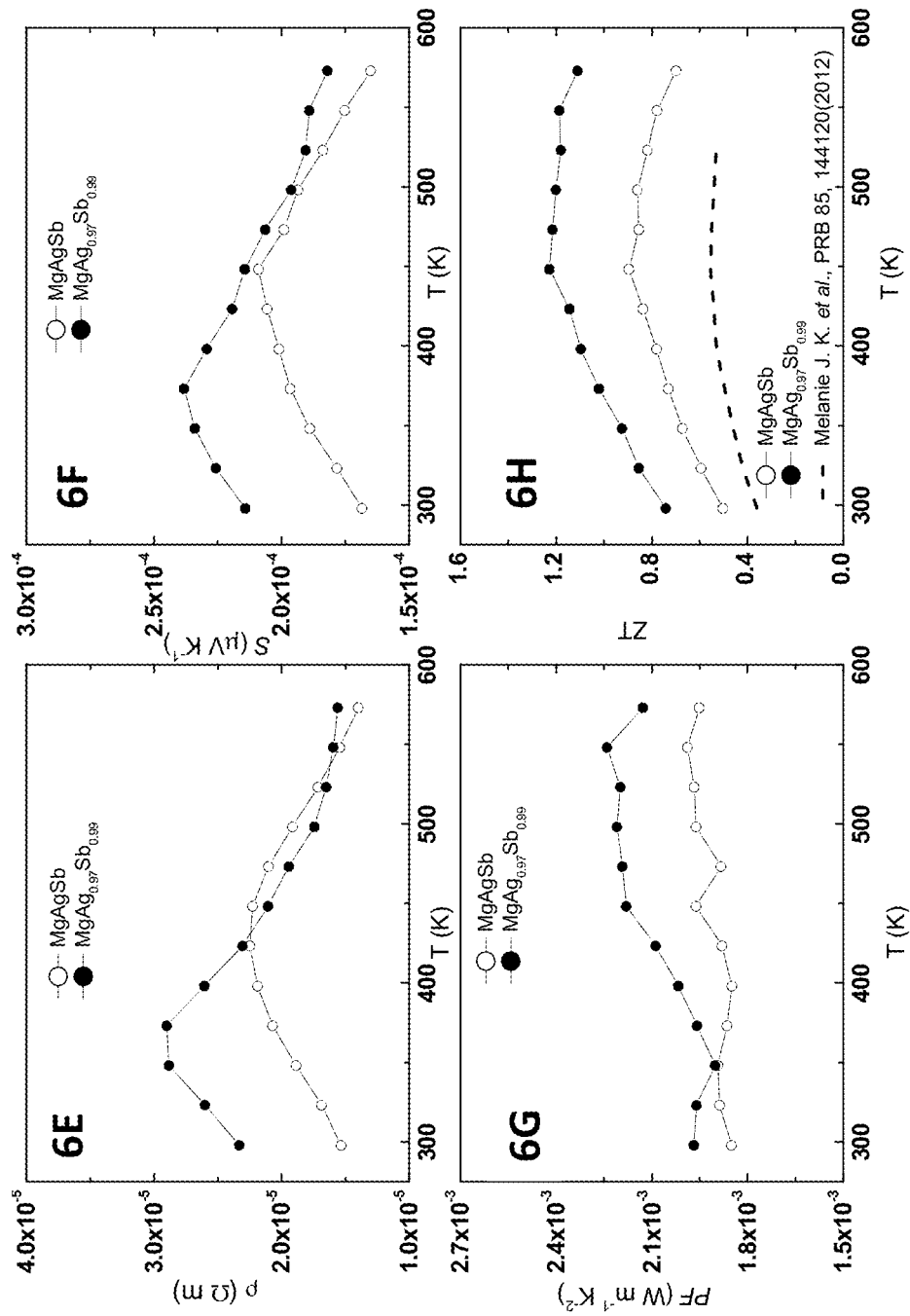

FIGS. 6E-6H illustrate electrical transport properties of samples of MgAgSb and MgAg$_{0.97}$Sb$_{0.99}$. FIG. 6E shows the temperature dependent electrical resistivity, MgAg$_{0.97}$Sb$_{0.99}$ has higher electrical resistivity below about 425 K and, about 425K, comparable to that of MgAgSb. At room temperature, the electrical resistivity of the MgAg$_{0.97}$Sb$_{0.99}$ is about 2.3×10$^{-5}$ Ωm at room temperature and increases to about 3×10$^{-5}$ Ωm at about 350 K before it decreases to about 1.6×10$^{-5}$ Ωm at about 575 K. Compared to Sb-substituted Bi$_{0.4}$Sb$_{1.6}$Te$_3$, the electrical resistivity of both MgAgSb and MgAg$_{0.97}$Sb$_{0.99}$ is comparably higher.

FIG. 6F is a graph that illustrates the temperature-dependent Seebeck coefficient for both samples. For the sample of MgAg$_{0.97}$Sb$_{0.99}$, the Seebeck starts at about 210 μV K$^{-1}$ at about 300 K and then increases to about 240 μV K$^{-1}$ before decreasing to about 180 μV K$^{-1}$ at about 575 K. These Seebeck values are comparable to those of Bi$_{0.4}$Sb$_{1.6}$Te$_3$ bulk alloy. Based on the simple formula on energy gap $E_G=2eS_{max}T$, where $S_{max}$ and T refer to the peak Seebeck coefficient and corresponding temperature, respectively, the band gap $E_G$ of MgAg$_{0.97}$Sb$_{0.99}$ was estimated to be of about 0.16 eV at room temperature, which is similar to that of Bi$_{0.4}$Sb$_{1.6}$Te$_3$.

FIG. 6G shows the power factor dependence of temperature for samples of MgAgSb and MgAg$_{0.97}$Sb$_{0.99}$. The power factors of the two samples are similar below 375 K, and increases with temperature but much lower than that of Bi$_{0.4}$Sb$_{1.6}$Te$_3$. FIG. 6H illustrates the figure of merit ZT for samples of MgAgSb and MgAg$_{0.97}$Sb$_{0.99}$, with the reported literature value shown for comparison. A ZT value of about 0.7 at room temperature (from about 59° F./15° C. to about 77° F./25° C.) for MgAg$_{0.97}$Sb$_{0.99}$ was observed. The ZT values increase with temperature with the maximum value of about 1.2 obtained at 450 K. For the stoichiometric composition MgAgSb, a ZT of about 0.5 at room temperature was achieved which is higher than the reported value of about 0.3 (25) due to lower thermal conductivity by the nano-sized grains, which may be below about 1000 nm in diameter in some embodiments, and below about 200 nm in diameter in alternate embodiments. In the embodiment discussed herein, the Ag site was selected since a small deficiency on Ag increased the power factor (FIG. 6G) and also reduced its lattice thermal conductivity (FIG. 6O). By using the Ni substitution, the thermal conductivity was reduced without degradation of the power factor.

Figures 7A, 7B, 7C, 7D:
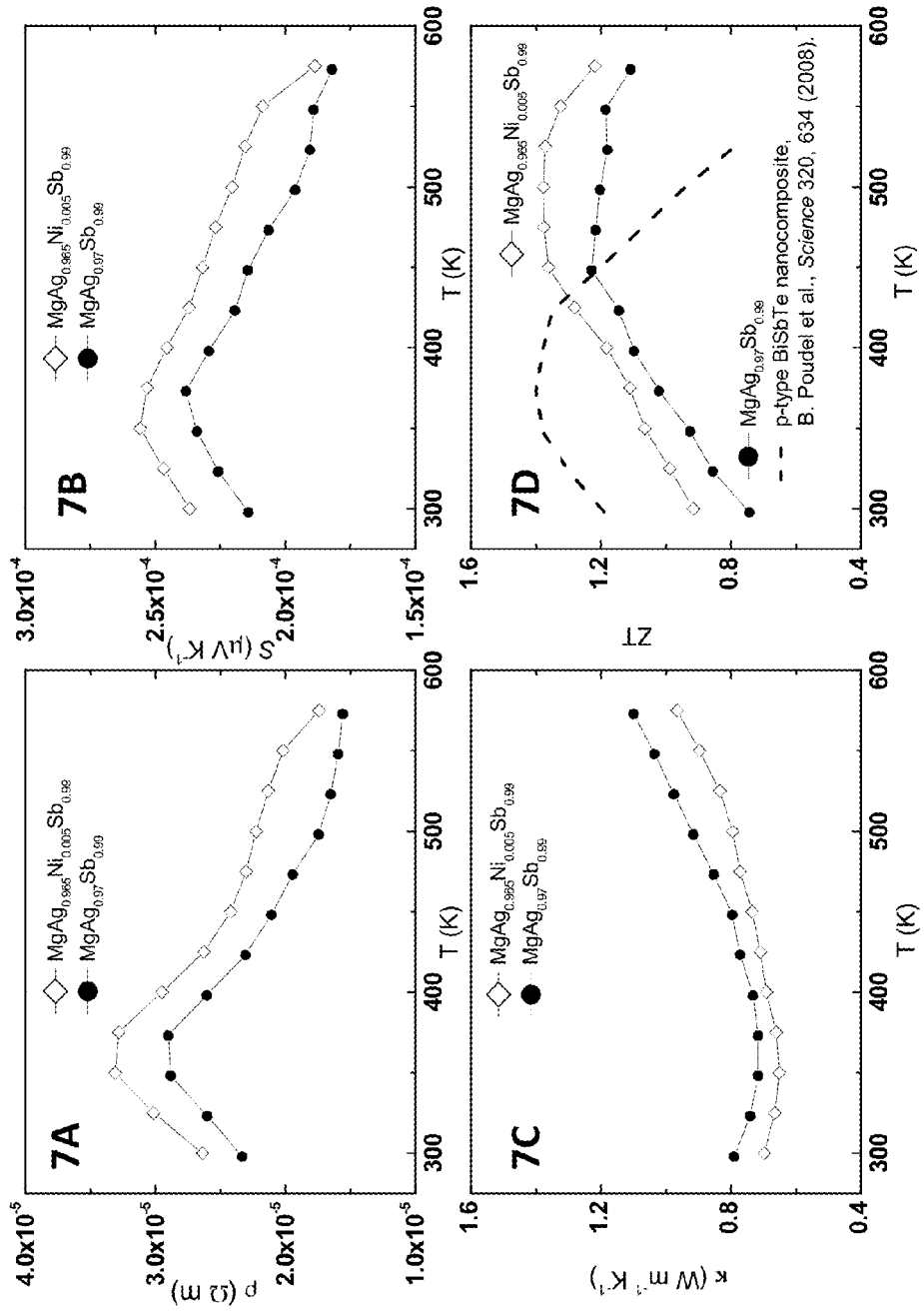
FIGS. 7A to 7D illustrate the thermoelectric properties of the Ni substituted samples fabricated using the formula $MgAg_{0.965}Ni_{0.005}Sb_{0.99}$ according to certain embodiments of the present disclosure.

FIGS. 7A to 7D illustrate the thermoelectric properties of samples fabricated according to the formula MgAg$_{0.965}$Ni$_{0.005}$Sb$_{0.99}$ according to embodiments of the present disclosure. Ni alloying into Ag sites increased the electrical resistivity as shown in FIG. 7A and, accordingly, also increases the Seebeck coefficient shown in FIG. 7B. In addition, as shown in FIG. 7O, the substitution of Ni for some of the Ag decreased the thermal conductivity to about 0.7 W m–1 K–1 at about 300 K. As shown in FIG. 7D, because of the lower thermal conductivity, a ZT of about 0.9 at about 300 K and about 1 at about 325 K in sample MgAg$_{0.965}$Ni$_{0.005}$Sb$_{0.99}$ was achieved. FIG. 7D illustrates that the peak ZT close to about 1.4 was obtained at 450 K. For comparison, the ZT of nanostructured Bi$_{0.4}$Sb$_{1.6}$Te$_3$, a conventional thermoelectric material possessing a range of desirable properties, is also shown in FIG. 7D.

Figure 8:
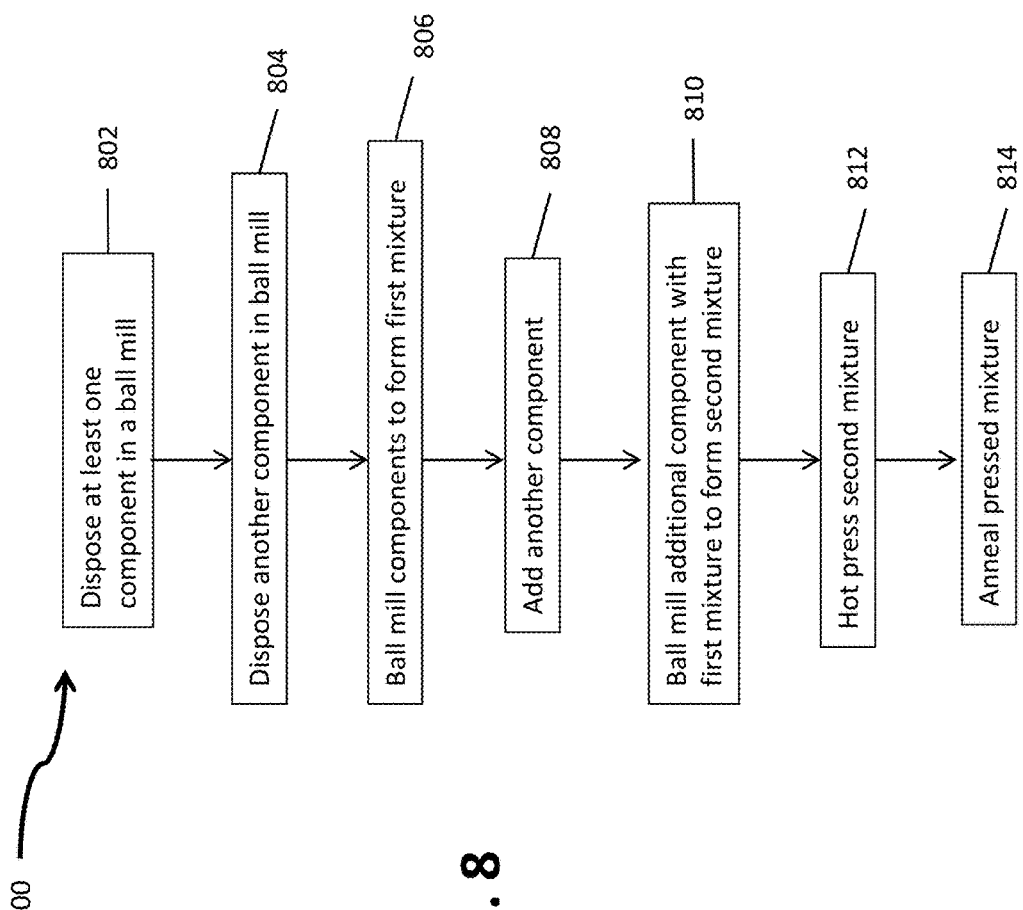
FIG. 8 is a flowchart of a method of manufacturing a thermoelectric material according to certain embodiments of the present disclosure.

FIG. 8 shows a flow chart of a method of manufacturing a thermoelectric material according to certain embodiments of the present disclosure. It is appreciated that the method 800 is an exemplary embodiment that may be employed with different variations, for example, in any of the ball-milling, hot-pressing, or annealing steps, depending upon the composition and end application of thermoelectric material. The method 800 may be employed in various configurations for all of the embodiments discussed herein, including at least those doped with Na, Ni, and Cu. At block 802 of method 800, a first component is disposed in a ball-milling apparatus or chamber. In an embodiment, the first component may comprise magnesium (Mg). At block 804, a second component is disposed in the ball-milling apparatus or chamber. In an embodiment, the second component may comprise silver (Ag). In some embodiments, multiple components may be disposed simultaneously, and the components may be powder, chunks, cubes, uniform pieces, irregular pieces, or any other shape as appropriate for further processing and/or the end application. It is appreciated that, while blocks 802, 804, and 806 may be distinct steps in one embodiment, in alternate embodiments, there may be more or less ball-milling blocks depending upon at least the composition and end application of the thermoelectric material In an embodiment, at block 806, the first component and the second component are ball-milled for a period between about 0.1 hours and about 100 hours. In some embodiments, the ball-milling may be performed with two components, and in alternate embodiments the ball-milling may be performed in a single process with all of the components ball-milled together in a single cycle or in multiple cycles to achieve a desired phase and/or grain size. In still other embodiments, the ball-milling maybe done in a plurality of steps in equal, ascending, descending, or otherwise varying amounts of time using some or all of the components that ultimately comprise the thermoelectric material. The ball-milling at block 806 may be referred to as the first ball-milling step.

At block 808, a third component may be added to the ball-milled mixture made at block 806, and at block 810, the third component is ball-milled with the first mixture to form a second mixture. In an embodiment, the third component may be antimony (Sb). In the above-described embodiment, when three components are ball-milled, the first two are ball-milled together and then the third is added in for a subsequent ball-milling at block 808. However, in alternate embodiments, more or less components may be used, and the components may be ball-milled together in two or more steps depending upon the composition and end application. In one example, a single component may be ball-milled to achieve a certain phase and/or particle size, and then additional components added and ball-milled in subsequent blocks. In an alternate example, multiple components may be ball-milled together with an additional single or multiple (not ball-milled), components subsequently added, or with an additional ball-milled single component, or with additional ball-milled mixtures of two or more components in various combinations of steps and times of ball-milling depending upon the desired phase, subsequent processing, and/or the desired properties for use in an end application.

At block 812, the second mixture is hot-pressed. In an embodiment, subsequent to hot-pressing, the ZT value is about 1 at room temperature. In alternate embodiments, the ZT value may vary between temperature ranges as discussed herein, depending at least in part upon both the composition of the material and the processing parameters. The hot-pressing at block 812 may be at a temperature between about 400 K and about 650 K and from a period of about 0.5 hours to about 60 min. In some embodiments, at block 814, subsequent to hot-pressing at block 812, the pressed component formed at block 812 may be annealed. The annealing may be between about 0.1 hours and about 100 hours. Subsequent to annealing, the ZT value at room temperature is about 1.

In one embodiment ZTs of about 1 were achieved at room temperature in MgAgSb-based materials including $MgAg_{0.965}Ni_{0.005}Ag_{0.99}$, through improving the phase purity and Ni alloying to Ag site. While Ni was used herein, other elements including but not limited to copper (Cu), zinc (Zn), and chromium (Cr) could also be used. In some embodiments, nickel (Ni), copper (Cu), zinc (Zn), gold (Au), titanium (Ti), vanadium (V), chromium (Cr), manganese (Mn), (iron) Fe, cobalt (Co), etc. may be substituted at the Ag site(s), and Na, K, Rb, Ca, Sr, Ba, Y, Lanthanides (La, Ce, Pr, . . . . Lu), etc. may be substituted at the Mg sites, and Al, Ga, In, Tl, Si, Ge, Sn, Pb, As, Bi, Se, Te, etc. may be substituted at the Sb site(s). Such a ZT at room temperature is comparable with that of the best p-type $Bi_{0.4}Sb_{1.6}Te_3$. In an embodiment, the point defects of Ag and Sb deficiency and antisites together with the nanosized grains may contribute to the low thermal conductivity of about 0.7 W m$^{-1}$ K$^{-1}$ at room temperature.

Figure 9:
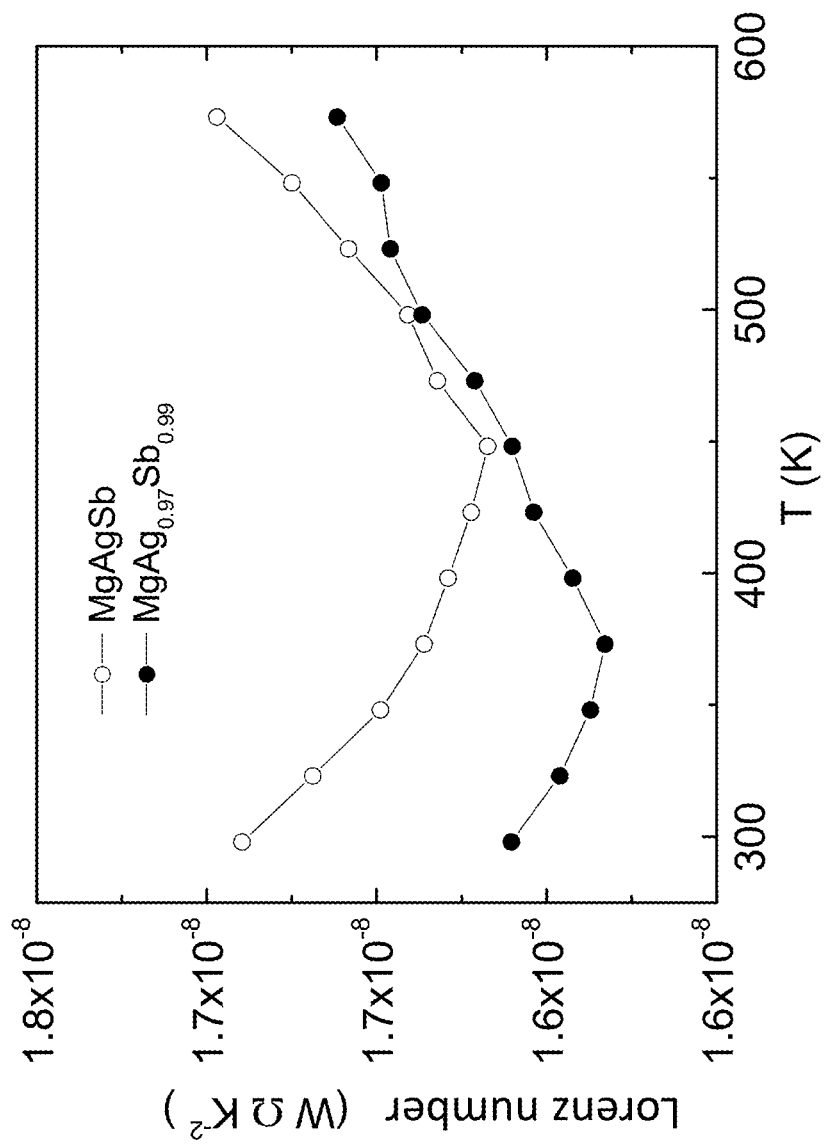
FIG. 9 illustrates the Lorenz numbers for samples of both $MgAg_{0.97}Sb_{0.99}$ and MgAgSb.

FIG. 9 illustrates the Lorenz numbers for samples of both $MgAg_{0.97}Sb_{0.99}$ and MgAgSb. A commonly used acoustic phonon scattering parameter r=−½ was used for the MgAgSb system. For a given material, the value of Lorenz number depends on the detailed band structure, position of the Fermi level and the temperature. A simple model for the calculation of the Lorenz number is indicated below.

In one example, the Lorenz number is given by $$L = \left(\frac{k_B}{e}\right)^2 \left[\frac{\left(r+\frac{7}{2}\right)F_{r+\frac{5}{2}}(\xi)}{\left(r+\frac{3}{2}\right)F_{r+\frac{1}{2}}(\xi)} - \left(\frac{\left(r+\frac{5}{2}\right)F_{r+\frac{3}{2}}(\xi)}{\left(r+\frac{3}{2}\right)F_{r+\frac{1}{2}}(\xi)}\right)^2\right]$$

where r is the scattering parameter, $k_B$ Boltzmann's constant, e the electron charge, and $F_n(\xi)$ the Fermi integral given by:

$$F_n(\xi) = \int_0^\infty \frac{\chi^n}{1+e^{\chi-\xi}} d\chi$$

where $\xi$ the reduced Fermi energy that can be calculated from the Seebeck coefficient and the scattering parameter r, which is given by $$S = \pm \frac{k_B}{e} \left[\frac{\left(r+\frac{5}{2}\right)F_{r+\frac{3}{2}}(\xi)}{\left(r+\frac{3}{2}\right)F_{r+\frac{1}{2}}(\xi)} - \xi\right]$$

Na-Doped MgAgSb

In alternate embodiments, in addition to the Ni-doping discussed above, Na and Cu-doped samples were fabricated according to certain embodiments of the present disclosure and are discussed in detail below.

In an alternate embodiment, $MgAg_{0.97}Sb_{0.99}$ was doped with sodium (Na) and the resultant fabricated thermoelectric materials comprised with ZT values above 1 in the temperature from 100 to 300° C. A plurality of samples were fabricated according to certain embodiments of the present disclosure according to the formula $Mg_{1-x}Na_xAg_{0.97}Sb_{0.99}$ with x=0.005, 0.0075, and 0.01. While three concentrations of x are discussed in embodiments herein, in other embodiments, x may range from about 0 to about 0.03. In alternate embodiments, the dopants discussed herein at least including Na, Ni, and Cu, may be present in concentrations greater than 0.03, depending upon factors including the end application. In an embodiment, Na-doped Mg, for example in samples fabricating according to certain embodiments of the present disclosure according to a formula of, $Mg_{1-x}Na_xAg_{0.97}Sb_{0.99}$, on the thermoelectric properties and found Na was effective to increase the carrier concentration and power factor, especially below 180° C., which led to higher ZT values, a better self-compatibility factor, and ultimately a higher output power. In one embodiment, an Na concentration of x from about 0.005 to about 0.0075 was used.

The efficiency of a TE material in a power generator or heat pump depends on material characteristics including the dimensionless thermoelectric figure of merit, ZT, defined as $ZT=(S^2a/K) T$, where S, a, K, and T are the Seebeck coefficient, electrical conductivity, thermal conductivity, and absolute temperature, respectively. In an embodiment, similar to the method discussed with reference to FIG. 8, elemental magnesium metal pieces (Mg, Sigma Aldrich, 99.9% metal basis), silver metal pieces (Ag, Sigma Aldrich, 99.9% metal basis), and sodium (Na, Sigma Aldrich, 99.9% metal basis) were weighed according to the stoichiometry of $Mg_{1-x}Na_xAg_{0.97}Sb_{0.99}$ with x=0, 0.005, 0.0075, and 0.01 and loaded in a stainless steel jar with stainless steel balls for mechanical alloying by a high energy ball mill (SPEX 80000) for 10 h. In an embodiment, antimony chunks (Sb, Sigma Aldrich, 99.8% metal basis) may be added into the jar to and further milled for about 8 h. The final nano-powders were then loaded into a graphite die with an inner diameter of 12.7 mm, and consolidated by direct current (DC) hot pressing at about 300° C. for 5 min.

Figure 10:
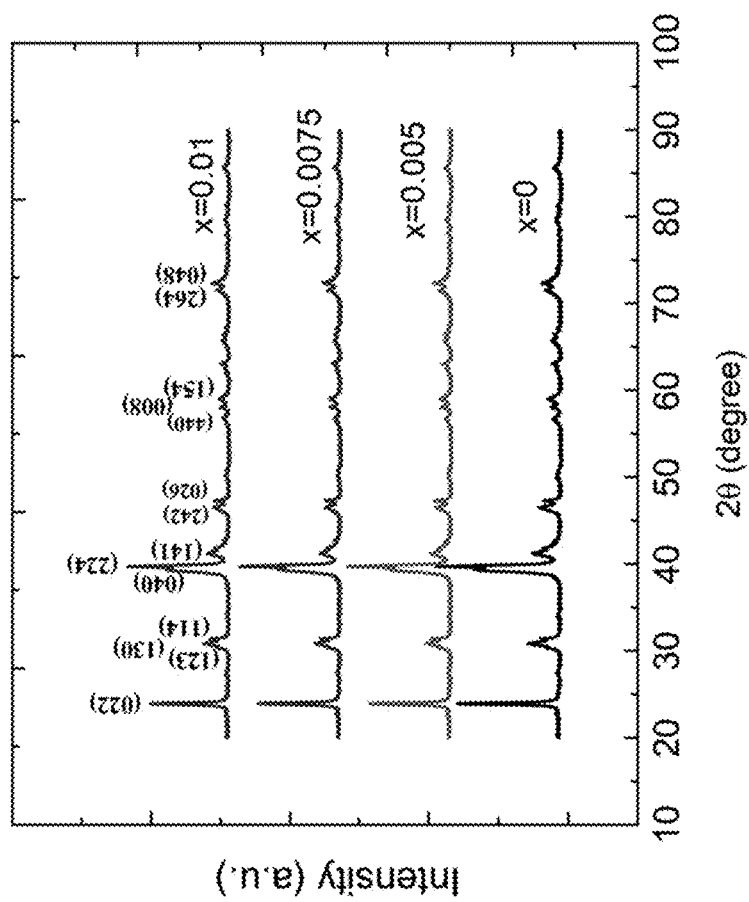
FIG. 10 shows the XRD patterns of samples of Na-doped MgAgSb according to certain embodiments of the present disclosure.

FIG. 10 shows the XRD patterns of samples of Na-doped MgAgSb according to certain embodiments of the present disclosure. FIG. 10 illustrates that, as compared to un-doped pure phase $MgAg_{0.97}Sb_{0.99}$, no detectable impurity phases were found in $Mg_{1-x}Na_xAg_{0.97}Sb_{0.99}$ (x=0.005, 0.0075, and 0.01). In an embodiment, a plurality of samples with compositions $Mg_{1-x}Na_xAg_{0.97}Sb_{0.99}$, where x=0, 0.005, 0.0075, and 0.01, were prepared. It is understood that, while exemplary embodiments are provided, x in $Mg_{1-x}Na_xAg_{0.97}Sb_{0.99}$ may be from about 0 to about 0.03, depending upon the embodiment.

Figure 11A:
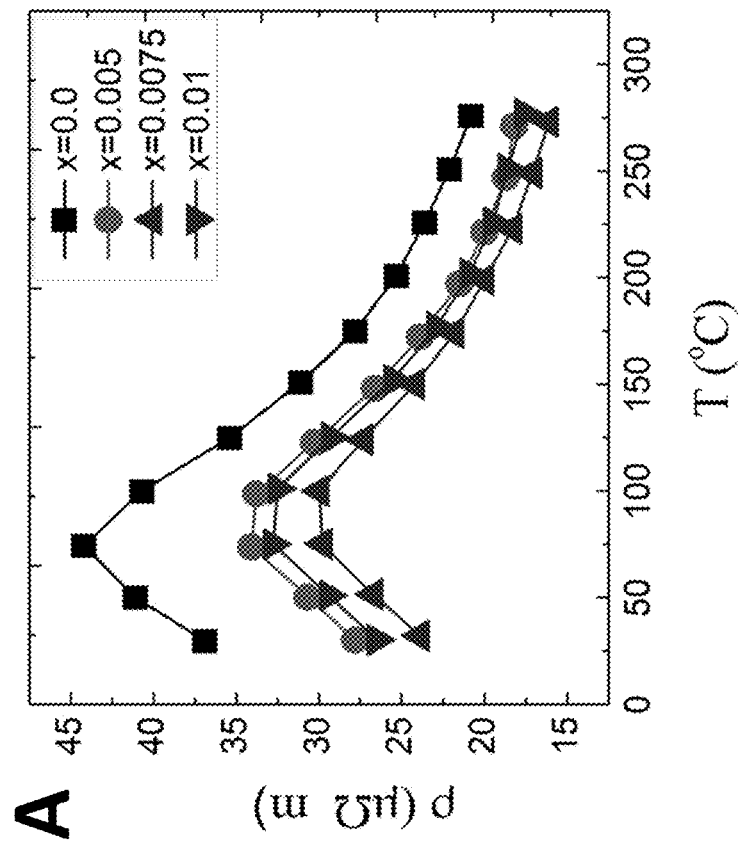
FIG. 11A illustrates the electrical resistivity of the plurality of samples fabricated according to certain embodiments of the present disclosure.

FIG. 11A illustrates the electrical resistivity of the plurality of samples fabricated according to certain embodiments of the present disclosure. As illustrated in FIG. 11A, the electrical resistivity decreases with increasing Na content up to about x=0.0075, and the electrical resistivity of all the samples first increases with temperature to the maximum around 75° C.-100° C. and then decreases.

Figure 11B:
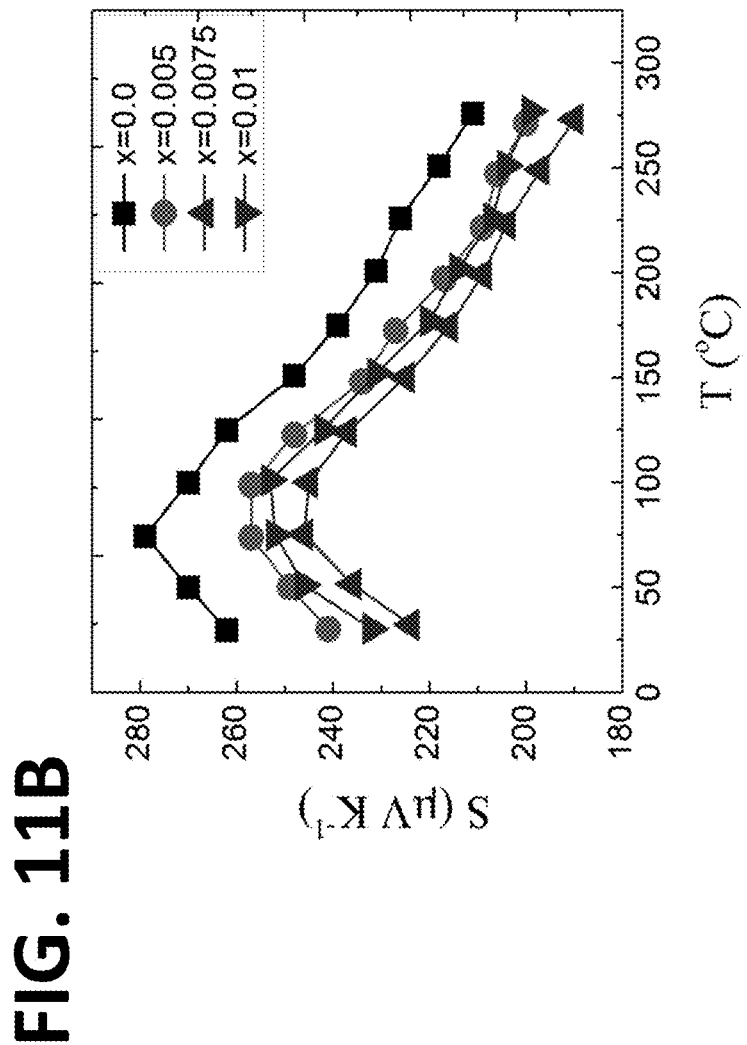
FIG. 11B illustrates the Seebeck coefficient of the plurality of samples fabricated according to certain embodiments of the present disclosure.

FIG. 11B illustrates the Seebeck coefficient of the plurality of samples fabricated according to certain embodiments of the present disclosure. When the temperature is above 100° C., the electrical resistivity decreases, which is consistent with the turning point in the Seebeck coefficient due to bipolar effect in as illustrated in FIG. 11B. Higher Na content leads to lower electrical resistivity due to the enhanced carrier concentration shown in Table 1. As shown in FIG. 11B, The Seebeck coefficient decreases with increasing Na content until x=0.0075, and increases with temperature from room temperature to 75-100° C. before it decreases up to 275° C.

TABLE 1

Carrier concentration and Hall mobility at room temperature of $Mg_{1-x}Na_xAg_{0.97}Sb_{0.99}$ (x = 0, 0.005, 0.0075, and 0.01).

| $Mg_{1-x}Na_xAg_{0.97}Sb_{0.99}$ | x = 0 | x = 0.005 | x = 0.0075 | x = 0.01 |
|---|---|---|---|---|
| Carrier concentration ($10^{19}$ cm$^{-3}$) | 2.413 | 3.198 | 3.49 | 3.455 |
| Hall mobility (cm$^2$ V$^{-1}$ s$^{-1}$) | 70.2 | 70.3 | 74.9 | 70.1 |

As shown in Table 1 (which illustrates the carrier concentrations ($n_H$) and Hall mobility ($u_H$) for samples fabricated according to certain embodiments of the present disclosure), compared to the undoped sample, the Na-doped samples of x=0.005, 0.0075, and 0.01, exhibited carrier concentration increases by 32.5%, 44.6% and 43.2%, respectively.

Figure 11C:
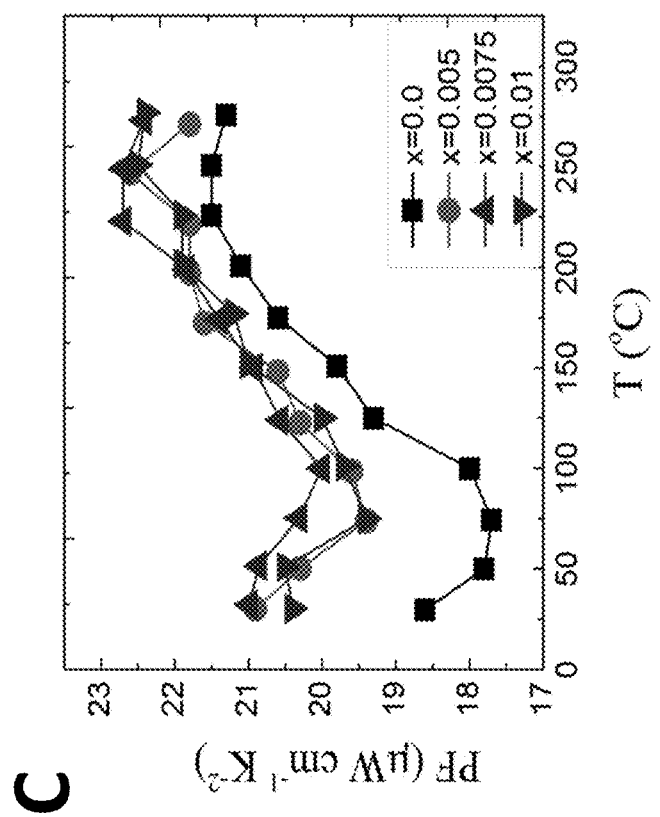
FIG. 11C illustrates the power factor (PF) of the plurality of samples fabricated according to certain embodiments of the present disclosure.

FIG. 11C illustrates the power factor (PF) of the plurality of samples fabricated according to certain embodiments of the present disclosure. The carrier concentration ($n_H$) and Hall mobility ($u_H$), which is also shown in Table 1, affect the electrical resistivity ($\rho$) by the relationship $1/\rho=n_H e u_H$. Combing the electrical resistivity and Seebeck coefficient, the power factors obtained for all Na doped samples are shown in FIG. 11C. The increase in power factor with temperature, especially below 100° C., is pronounced as Na content increases. In an embodiment, the highest power factor was found for x=0.0075. Na doping tends to optimize carrier concentration and mobility, leading to lower electrical resistivity, yielding improvement of power factor over the whole temperature range.

Figure 12A:
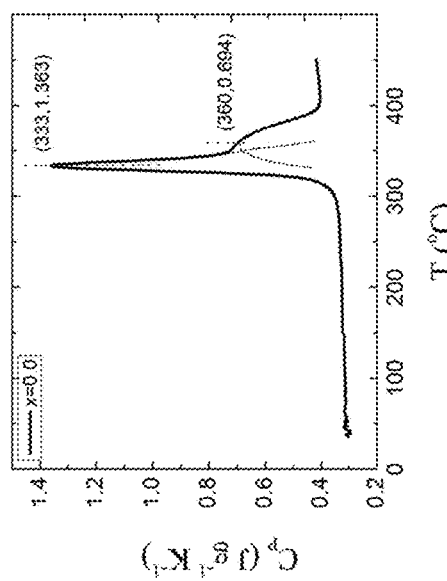
FIGS. 12A-12D illustrate the thermal transport properties of $Mg_{1-x}Na_xAg_{0.97}Sb_{0.99}$ with x=0, 0.005, 0.0075, and 0.01, according to certain embodiments of the present disclosure.
Figure 12B:
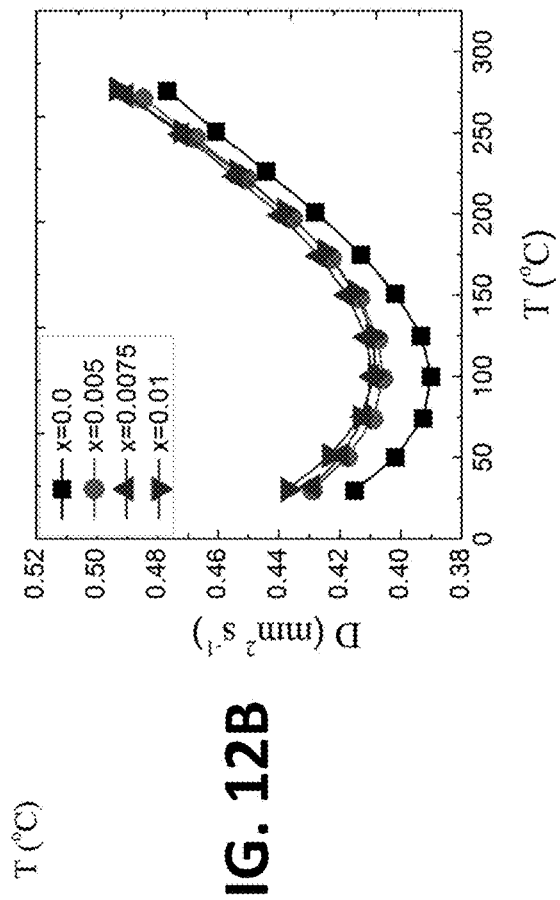
Figure 12D:
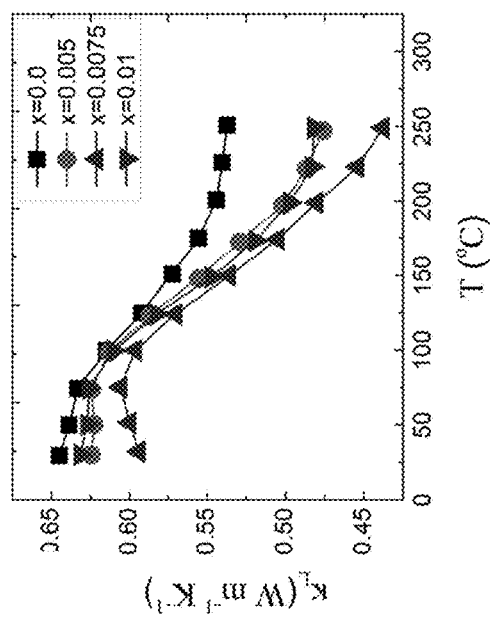
Figure 12C:
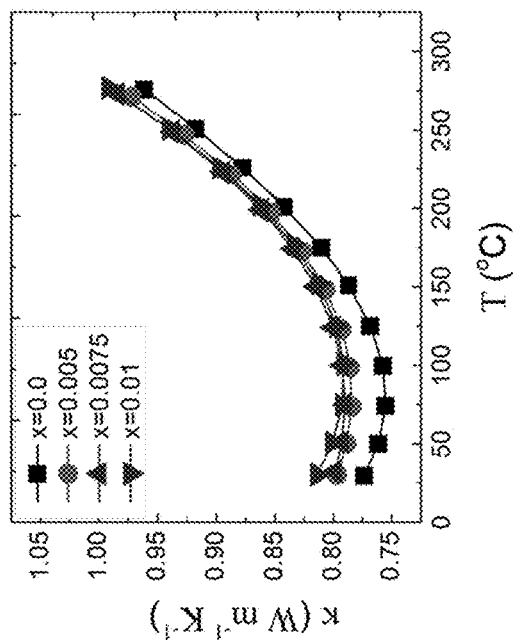

FIGS. 12A-12D illustrate the thermal transport properties of $Mg_{1-x}Na_xAg_{0.97}Sb_{0.99}$ with x=0, 0.005, 0.0075, and 0.01, according to certain embodiments of the present disclosure. FIG. 12A illustrates the specific heat ($C_p$) of $MgAg_{0.97}Sb_{0.99}$, this value of $C_p$ was used for all compositions, since replacing a tiny amount of Mg with Na will not increase the $C_p$ at all due to the fact that Na is next to Mg on the periodic table. FIG. 12B illustrates the diffusivity (D) of all samples $Mg_{1-x}Na_xAg_{0.97}Sb_{0.99}$. $C_p$ and D are used to calculate the total thermal conductivity ($\kappa$) of a series of doped samples using $\kappa=D\rho C_p$, where $\rho$ is the measured density of the samples. The densities of all the samples $Mg_{1-x}Na_xAg_{0.07}Sb_{0.99}$ with x=0, 0.005, 0.0075, and 0.01 measured by Archimedes method are 6.17, 6.168, 6.165, 6.185 cm$^{-3}$, respectively, which is about 98% of the theoretical density 6.31 g cm$^{-3}$. The $C_p$ dependence of temperature shows that there are two phase transitions with increasing temperature, from the $\alpha$ phase to the $\beta$ phase at about 333° C. and from the $\beta$ phase to the $\gamma$ phase at about 360° C. FIG. 12C illustrates the thermal conductivity of the plurality of samples fabricated according to certain embodiments of the present disclosure, and FIG. 12D illustrates the lattice contributions (lattice thermal conductivity) of the plurality of samples fabricated according to certain embodiments of the present disclosure.

As shown in FIG. 12C, the thermal conductivity decreases with temperature first, reaching a minimum at around 75-100° C., and then increases from 100° C. to 275° C. due to the bipolar effect, which is consistent with electrical resistivity curves. As Na content increases, the thermal conductivity ($\kappa$) increases and lattice thermal conductivity ($\kappa_L$) decreases. The lattice thermal conductivity $\kappa_L$ was determined by subtracting the electronic contribution $\kappa_e$, $\kappa_L=\kappa-\kappa_e$, $\kappa_e$ is calculated using the Wiedemann-Franz relation $\kappa_e=L\sigma T$, where L is the Lorenz number, which can be obtained from fitting the respective Seebeck coefficient values with an estimate of the reduced chemical potential. As shown in FIG. 12C for the undoped sample MgAg$_{0.97}$Sb$_{0.99}$, the low thermal conductivity over the whole temperature range from 25 to 275° C. may be attributed to the distorted structure, large unit cell and the strong phonon scattering due to the deficiencies at both the Ag and Sb sites, and small grain size. In one embodiment, Na doped samples with fairly good uniform grains in the range of about 50 nm to about 200 nm are very similar to the undoped MgAg$_{0.97}$Sb$_{0.99}$ sample.

FIG. 13A illustrates an SEM image of thermoelectric materials fabricated according to certain embodiments of the present disclosure. FIG. 13A is an image of a freshly fractured surface of the bulk samples Mg$_{0.9925}$Na$_{0.0075}$Ag$_{0.97}$Sb$_{0.99}$ to examine the homogeneities of the grains. FIG. 13B is a low-resolution TEM image of a sample of Mg$_{0.9925}$Na$_{0.0075}$Ag$_{0.97}$Sb$_{0.99}$, fabricated according to certain embodiments of the present disclosure. FIG. 13B shows the same results as the SEM image in FIG. 13A, confirming the grains are in the range of 50-200 nm. The black dots 1302, which are circled in FIG. 13B as well as indicated by white/light colored arrows, may comprise the nano-precipitates. FIG. 13C is a high resolution TEM image of a sample of Mg$_{0.9925}$Na$_{0.0075}$Ag$_{0.97}$Sb$_{0.99}$, which indicates the grains are crystallized.

FIG. 14 illustrates the temperature dependent ZT for Mg$_{1-x}$Na$_x$Ag$_{0.97}$Sb$_{0.99}$ (x=0, 0.005, 0.0075, and 0.01) fabricated according to certain embodiments of the present disclosure. With increasing temperature, the ZT value increases, reaching a peak ZT about 1.26 at about 250° C. for Mg$_{0.9925}$Na$_{0.0075}$Ag$_{0.97}$Sb$_{0.99}$. Na-doped samples show generally a little better performance. At 30° C., a ZT of about 0.8 was obtained in samples Mg$_{1-x}$Na$_x$Ag$_{0.97}$Sb$_{0.99}$ with x=0.005 and 0.0075.

Figure 15:
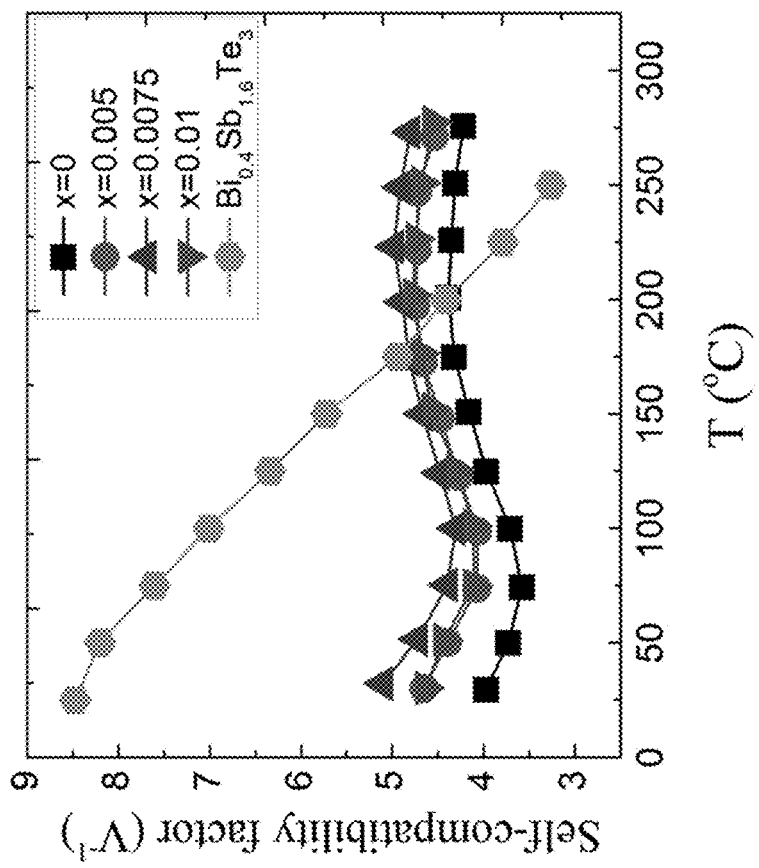
FIG. 15 shows the self-compatibility factors of samples $Mg_{1-x}Na_xAg_{0.97}Sb_{0.99}$ (x=0, 0.005, 0.0075, and 0.01) fabricated according to certain embodiments of the present disclosure.

FIG. 15 shows the self-compatibility factors of samples Mg$_{1-x}$Na$_x$Ag$_{0.97}$Sb$_{0.99}$ (x=0, 0.005, 0.0075, and 0.01) fabricated according to certain embodiments of the present disclosure. The self-compatibility factor c=($\sqrt{1+ZT}$−1)/ST, calculated from the temperature dependent Seebeck Coefficient and ZT, is regarded as a thermoelectric property essential for designing an efficient segmented thermoelectric device. For a single material, it is called self-compatibility factor. The physics of compatibility is about the matching of the physical properties over the whole length of the thermoelectric leg. The change in compatibility factor will have an effect on device performance since it is temperature dependent. A large difference of each individual property for the cold and hot side will cause incompatibility. The self-compatibility factors of most Na doped samples vary less than 15%. Compared to other materials, such as Bi$_{0.4}$Sb$_{1.6}$Te$_3$, the self-compatibility of MgAgSb-based materials shows much less temperature dependence, which will contribute to a relatively higher efficiency.

To predict the thermoelectric performance under a certain temperature difference, a numerically iterative calculation was carried out based on a finite difference model in which the temperature dependence of thermoelectric properties was taken into account. The governing equation of 1-D energy balance in a differential element of thermoelectric leg is, $$\frac{d}{dx}\left(\kappa(T(x))\frac{dT(x)}{dx}\right) + J^2\rho(T(x)) - JT(x)\frac{dS(T(x))}{dx} = 0 \quad (1)$$

where, T(x) is temperature distribution through a thermoelectric leg as a function of position x (x=0 for T$_H$), and J is electric current density, $\kappa$(T(x)), $\rho$(T(x)) and S(T(x)) are temperature dependent thermal conductivity, electric resistivity, and Seebeck coefficient, respectively. The three terms on the left hand side of the equation represent conduction heat, Joule heat, and Thomson heat, respectively. By applying Eq. (1) into each differential element, numerically converged temperature profile and current density followed by output power and conversion efficiency can be obtained. In this model, an adiabatic condition is assumed and only thermoelectric leg is considered by ignoring electrical contact resistances. Two sets of the leg dimensions are examined: 1.0 mm and 1.5 mm of leg lengths with a fixed cross section of 1.5 mm×1.5 mm.

Figure 16A:
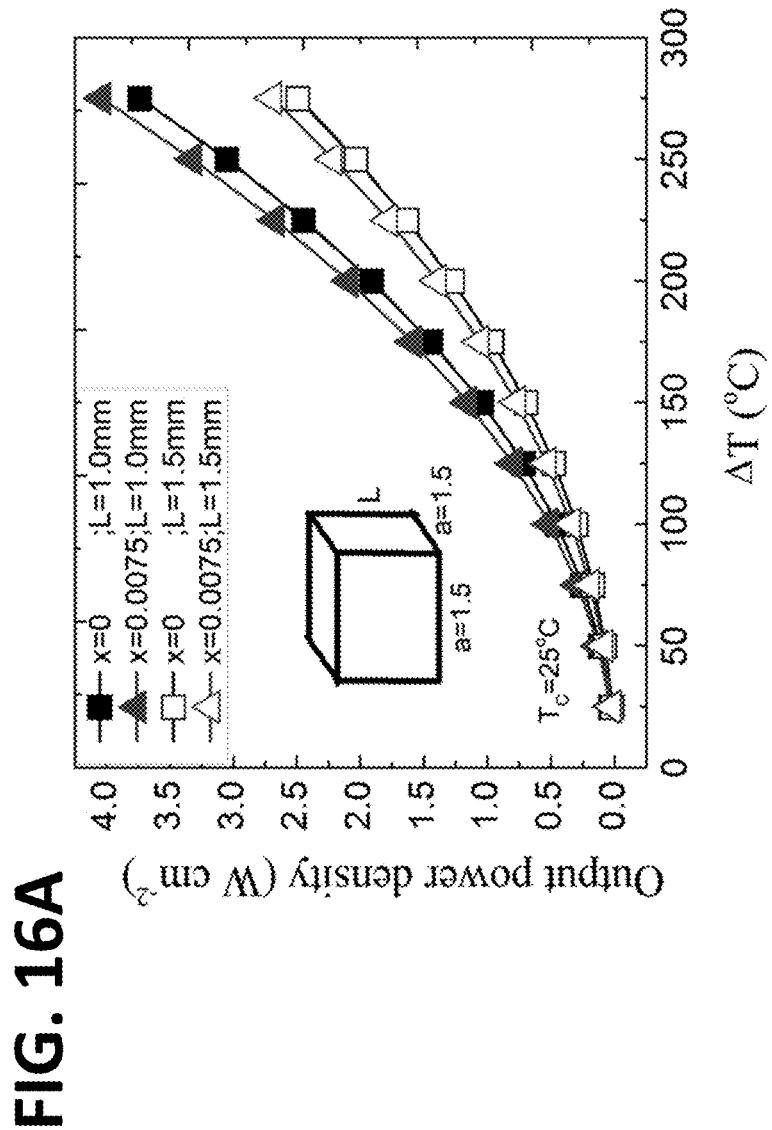
FIG. 16A is a graph of the generated output power density, W cm$^{-2}$, at various temperature differences of thermoelectric materials fabricated according to certain embodiments of the present disclosure.

FIG. 16A is a graph of the generated output power density, W cm$^{-2}$, at various temperature differences between thermoelectric materials fabricated according to certain embodiments of the present disclosure. As compared with the undoped MgAg$_{0.97}$Sb$_{0.99}$, the output power of Na-doped Mg$_{0.9925}$Na$_{0.0075}$Ag$_{0.97}$Sb$_{0.99}$ increases by 8.1% at ΔT=275° C. in both L=1.0 and 1.5 mm mainly due to the enhancement of the power factor by lowering electric resistivity while the conversion efficiency is only improved by 3.0%.

Figure 16B:
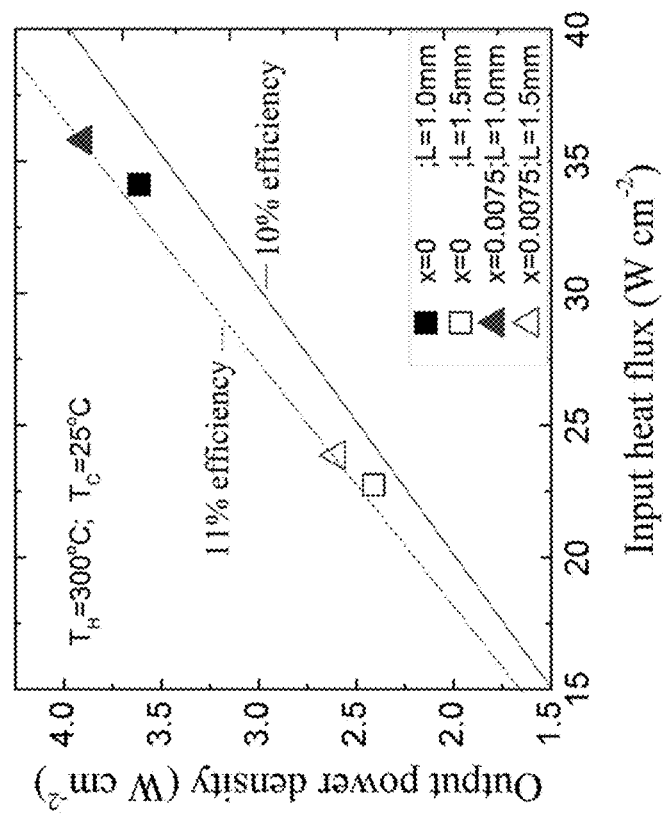
FIG. 16B illustrates the output power density and the input head flux of thermoelectric materials fabricated according to certain embodiments of the present disclosure.

FIG. 16B illustrates the output power density and the input head flux of thermoelectric materials fabricated according to certain embodiments of the present disclosure. The improvement of the leg efficiency is smaller than that of the output power which may because the improved output power is offset by the larger required input heat flux as shown FIG. 16B to maintain the constant temperature difference, which is caused by the increased thermal conductivity as shown in FIG. 12C. The leg with L=1.0 mm gives a larger power output by 50% at ΔT=275° C. as compared to the leg with L=1.5 mm since the shorter leg reduces the electrical resistance resulting in more electric current flow under the constant load voltage based on the fixed ΔTs. Thus, a shorter thermoelectric leg is desired to boost the output power generation once the boundary temperatures T$_H$ and T$_C$ are constantly maintained, which can improve volumetric power density (W m$^{-3}$), mass power density (W kg$^{-1}$), and cost-effectiveness (W \$$^{-1}$) as well. In addition, electric contact resistance, thermal resistance of electrodes and insulation materials, and thermal shear stress at bonding interfaces of dissimilar materials are also taken into account to figure out proper geometry of a leg.

Cu-Doped MgAgSb

In an alternate embodiment, a plurality of thermoelectric materials were fabricated by substituting some (x) silver (Ag) with copper (Cu) according to the formula MgAg$_{y-x}$Cu$_x$Sb$_z$, In one example, samples of MgAg$_{0.97-x}$Cu$_x$Sb$_{0.99}$ were fabricated according to certain embodiments of the present disclosure. In particular, samples were fabricated with respective Cu contents of x=0, 0.003, 0.007, and 0.01 in order to decrease the lattice thermal conductivity without sacrificing the power factor (PF). In other embodiments, the Cu contents (x) may range from about 0 to about 0.03. As illustrated herein, the Cu substitution not only reduced the thermal conductivity, but also improved the power factor (PF), leading to improved figure of merit (ZT) values. In one embodiment, MgAg$_{0.963}$Cu$_{0.007}$Sb$_{0.99}$ showed the highest ZT values of 0.95 at room temperature and 1.32 at 250° C. In addition, the MgAgSb-based samples displayed much better self-compatibility factors than the conventionally used Bi$_{0.4}$Sb$_{1.6}$Te$_3$. The effect of grain orientation on the anisotropy of thermoelectric properties of MgAg$_{0.97}$Sb$_{0.99}$ is also discussed below.

Generally, the thermal conductivity is the sum of the lattice and electronic thermal conductivity ($\kappa_{total}=\kappa_{latt}+\kappa_{ele}$) Electronic (S, σ) and thermal transport properties (κ) are interdependent, changing one will negatively affect the others, which is the reason why improving ZT has proven so challenging. In the past decades, much effort has been made to improve power factor ($S^2\sigma$) by band engineering, quantum confinement and lattice thermal conductivity reduction by nanostructuring, which has resulted in good improvement of thermoelectric performance of many materials, including $Bi_2Te_3$-based, PbX (X=Te, Se, S), skutterudites, half-Heuslers, SiGe, SnX (X=Te, Se), etc. However, $Bi_2Te_3$ and its derivatives with Sb and Se are conventionally selected for cooling applications and waste heat recovery at temperatures lower than 200° C. because of their higher ZTs in that temperature range. It is well known that Te is a rare element on earth.

The disclosure herein illustrates the thermoelectric properties of $MgAg_{0.97-x}Cu_xSb_{0.99}$. In one embodiment, a very small amount of Cu, e.g., x=0.007 in $MgAg_{0.963}Cu_{0.007}Sb_{0.99}$, produces lower thermal conductivity and higher power factor by increasing the electrical conductivity, leading to higher ZT values of 0.95 at 25° C. and 1.32 at 250° C. In addition, the properties of thermal and electrical transport in directions both parallel and perpendicular to the hot press direction is also discussed herein to evaluate the effect of grain orientation on the thermoelectric performance of MgAgSb.

A plurality of $MgAg_{0.97-x}Cu_xSb_{0.99}$ samples were fabricated according to various embodiments of the present disclosure. In an embodiment, three values of "x" were used: x 0, 0.003, 0.007, and 0.01, materials were synthesized by the two-step ball milling and hot pressing method as discussed herein. In an embodiment, magnesium (Mg, Sigma Aldrich, 99.8% metal basis), silver (Ag, Sigma Aldrich, 99.9% metal basis), and copper (Cu, sigma Aldrich, 99.9%) according to the designed ratio were loaded into a stainless steel jar with balls inside an argon-filled glove box, followed by ball milling for 10 hours. Following this step, antimony (Sb, Sigma Aldrich, 99.8% metal basis) chunks were added into the jar inside the glove box, with another ball milling of 8 hours. The final powders were hot pressed at about 300° C. for about 5 minutes. The as-pressed disc was then annealed at about 275° C. in air for 30 min prior to structure characterizations and property measurements.

X-ray diffraction spectra were collected on a PANalytical multipurpose diffractometer with an X'celerator detector (PANalyticalX'Pert Pro). The microstructures were investigated by a scanning electron microscope (SEM, JEOL 6340F) and transmission electron microscope (TEM, JEOL 2010F). The hot pressed samples were cut into bars with dimensions of 2 mm×2 mm×12 mm for simultaneous measurement of electrical resistivity and Seebeck coefficient using a commercial system (ULVAC ZEM-3 under a helium atmosphere from room temperature to 275° C.). The thermal and electrical transport properties were measured in the same direction. The hot pressed samples were cut and polished into flat, round discs comprising an average diameter of about 12.7 mm and an average thickness of about 1 mm for thermal diffusivity measurements. The thermal conductivity κ was calculated using $\kappa=\rho DC_p$, where ρ is the volumetric density determined by the Archimedes method, D the thermal diffusivity measured by laser flash apparatus (Netzsch LFA 457), and $C_p$ the specific heat obtained on a differential scanning calorimetry thermal analyzer (Netzsch DSC 404 C). The uncertainty for the electrical conductivity is 3%, the Seebeck coefficient 5%, and the thermal conductivity 7%, so the combined uncertainty for the power factor is 10% and the uncertainty for the ZT value is about 12%.

Figure 17:
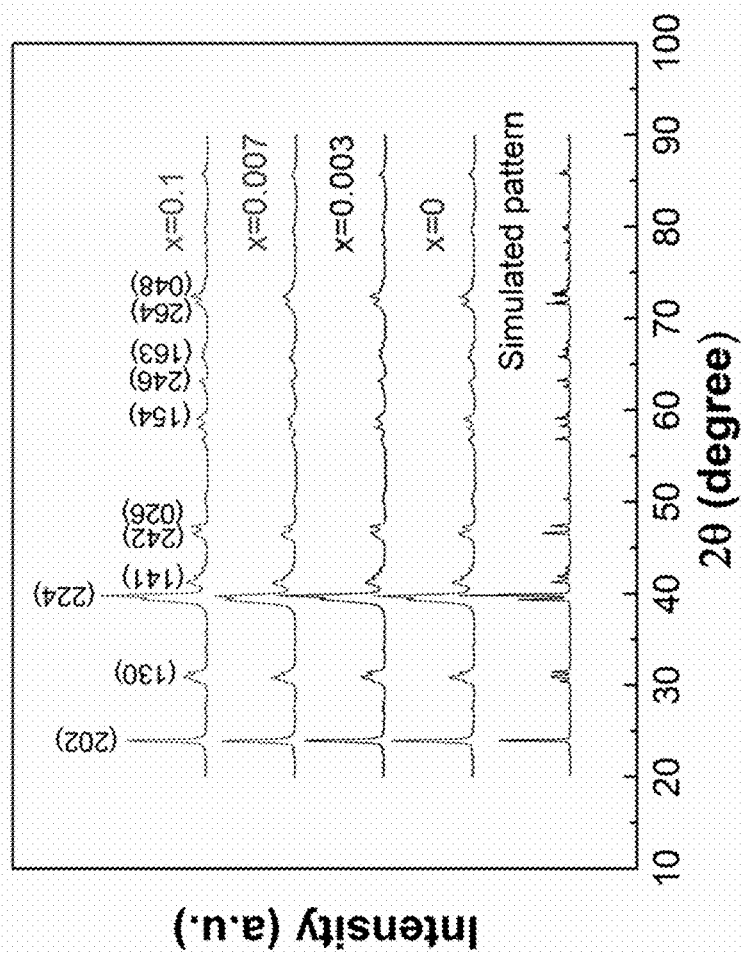
FIG. 17 is an x-ray diffraction (XRD) pattern of a plurality of samples of $MgAg_{0.97-x}Cu_xSb_{0.99}$ with varying copper (Cu) content, fabricated according to certain embodiments of the present disclosure.

FIG. 17 is an x-ray diffraction (XRD) pattern of a plurality of samples of $MgAg_{0.97-x}Cu_xSb_{0.99}$ with varying copper (Cu) content, fabricated according to certain embodiments of the present disclosure. All the diffraction peaks show an excellent match to the simulation of α-phase MgAgSb. No noticeable impurity phases were observed. Based on the simple formula on energy gap $E_g=2eS_{max}T$ developed by Goldsmid, where $S_{max}$ and T refer to the peak Seebeck coefficient (FIG. 19B discussed below) and corresponding temperature, respectively, the band gap $E_g$ of $MgAg_{0.97-x}Cu_xSb_{0.99}$ samples was estimated and listed in Table 2.

TABLE 2

Carrier concentration, Hall mobility, band gap at room temperature of $MgAg_{0.97-x}Cu_xSb_{0.99}$ (x = 0, 0.003, 0.007, and 0.01) samples.

| $MgAg_{0.97-x}Cu_xSb_{0.99}$ | x = 0 | x = 0.003 | x = 0.007 | x = 0.01 |
|---|---|---|---|---|
| Carrier concentration ($10^{19}$ cm$^{-3}$) | 2.3 | 2.8 | 3.4 | 3.6 |
| Hall mobility (cm$^2$ V$^{-1}$ s$^{-1}$) | 73.6 | 72.7 | 73.8 | 54.1 |
| Band gap (eV) | 0.21 | 0.19 | 0.18 | 0.19 |

The band gap is first decreased and then increased with increasing of the Cu content. The carrier concentration listed in Table 2 is increased when the Cu content is increased up to 0.7%, and then saturated when the Cu content is 1%. Meanwhile, the mobility of $MgAg_{0.96}Cu_{0.1}Sb_{0.99}$ sample is also markedly decreased. From the change of carrier concentration and band gap as a function of Cu content, it can be concluded that the Cu is successfully incorporated into the lattice in $MgAg_{0.97-x}Cu_xSb_{0.99}$, and a very minor second phase beyond the detectability of the XRD spectrometer could exist in the $MgAg_{0.96}Cu_{0.01}Sb$ sample. The Cu solubility limit in the $MgAg_{0.97}Sb_{0.99}$ may be around 0.7%.

Figures 18A, 18B, 18C:
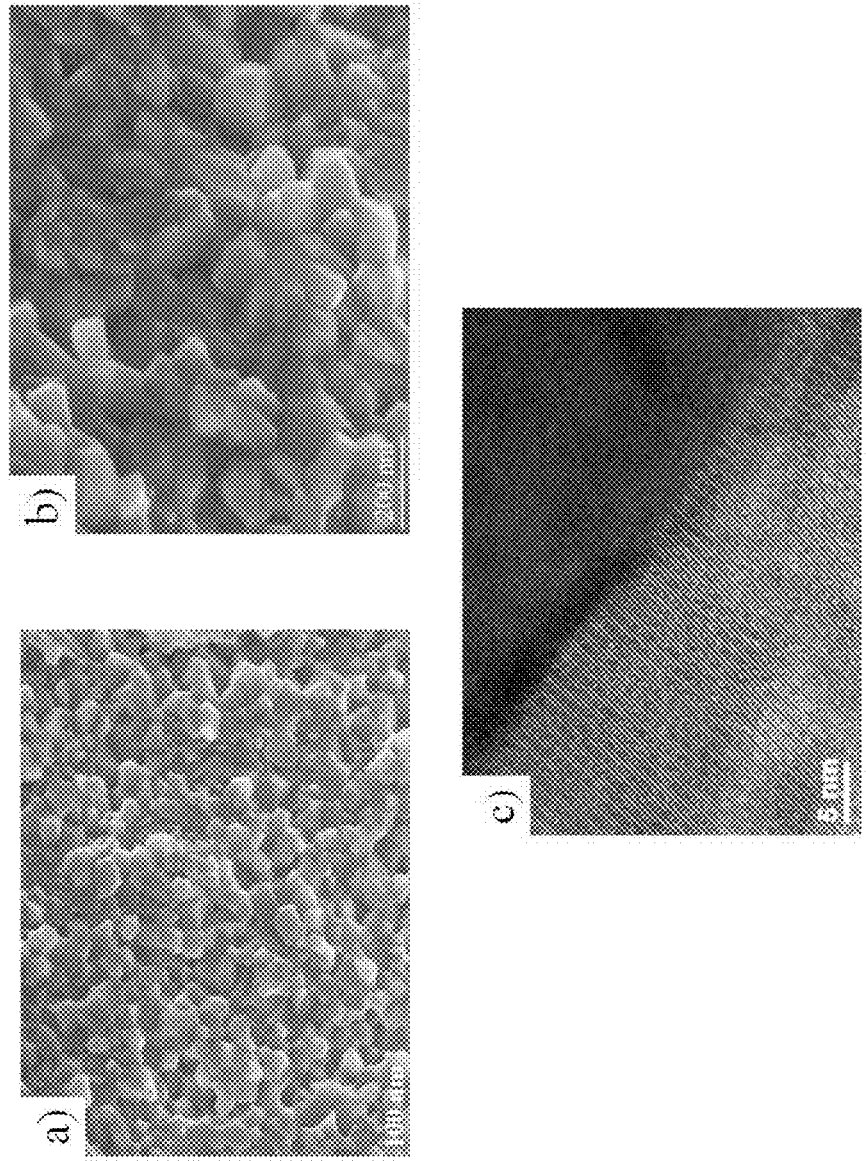
FIGS. 18A-18C are scanning electron microscope (SEM) images of thermoelectric materials fabricated according to certain embodiments of the present disclosure.

FIGS. 18A and 18B are scanning electron microscope (SEM) images of thermoelectric materials fabricated according to certain embodiments of the present disclosure. FIGS. 18A and 18B illustrate that the sample is densely packed and the grain size varies from 40 nm to 200 nm. It is shown in FIG. 18C that individual grains are highly crystallized and the grain boundaries are clean. The elemental distributions determined by energy dispersive X-ray spectroscopy (EDX) indicate that all the elements are homogeneously distributed throughout the sample.

Figure 19A:
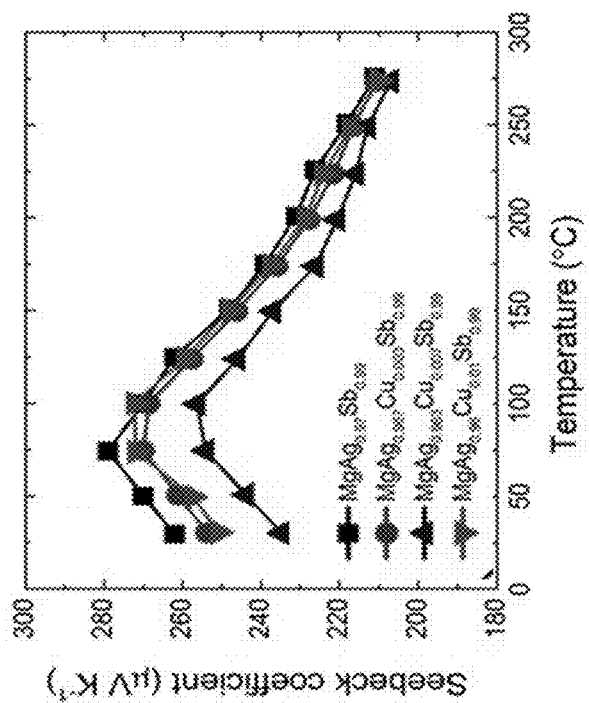
FIGS. 19A-19F are graphs illustrating the temperature dependence of thermoelectric properties of $MgAg_{0.97-x}Cu_xSb_{0.99}$ samples fabricated according to certain embodiments of the present disclosure.

FIGS. 19A-19F are graphs illustrating the temperature dependence of thermoelectric properties of $MgAg_{0.97-x}Cu_xSb_{0.99}$ samples. As seen in FIG. 19A, the electrical resistivity of all samples first increases and then decreases with increasing temperature. For Cu substituted samples, the electrical resistivity is lower than that of $MgAg_{0.97}Sb_{0.99}$ sample over the entire temperature range as shown in FIG. 19A. Meanwhile, the electrical resistivity is first decreased and then increased with the increase of the Cu content at any temperature. It is worthy noting that Cu substitution for Ag in $MgAg_{0.97-x}Cu_xSb_{0.99}$ materials decreases the electrical resistivity, especially for $MgAg_{0.063}Cu_{0.007}Sb_{0.99}$ sample. It is about about 25 μΩm at room temperature, and increases to about 33 μΩm at 100° C. before it decreases to about 18 μΩm at 275° C. Table 2 below lists the carrier concentration ($n_H$) and Hall mobility ($\mu_H$) dependence of Cu content in $MgAg_{0.97-x}Cu_xSb_{0.99}$ samples.

The carrier concentration and Hall mobility affect the electrical resistivity (ρ) of $MgAg_{0.97-x}Cu_xSb_{0.99}$ samples by the relationship $1/\rho=n_H$ $e\mu_H$. Compared with the $MgAg_{0.97}Sb_{0.99}$ sample, the $MgAg_{0.97-x}Cu_xSb_{0.99}$ (x=0.003 and 0.007) samples possess lower electrical resistivity, which could be attributed to the enhanced carrier concentration and almost unchanged Hall mobility listed in Table 2. Oppositely, when the Cu substitution is 0.01, the electrical resistivity of $MgAg_{0.96}Cu_{0.01}Sb_{0.99}$ is increased compared to the $MgAg_{0.963}Cu_{0.007}Sb_{0.99}$ sample, which could be ascribed to the decreased Hall mobility caused by the appearance of a minor secondary phase beyond the detectability of the XRD spectrometer.

Figure 19B:
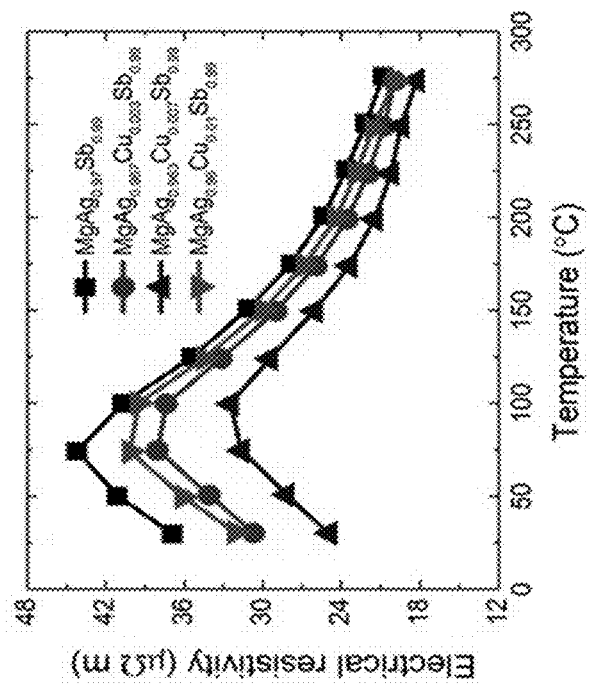

For $MgAg_{0.97-x}Cu_xSb_{0.99}$ samples, the Seebeck coefficient displays similar trend with the electrical resistivity as shown in FIG. 19B. The positive Seebeck coefficient indicates a p-type electrical transport behavior. It is shown that the Seebeck coefficient reaches a maximum at around 75° C. and 100° C. for the $MgAg_{0.97}Sb_{0.99}$ and Cu substituted samples, respectively. This onset is also reflected in the upturn thermal conductivity (discussed later in FIG. 19D). The bipolar effect affects the Seebeck coefficient due to the contribution of minority carriers. For $MgAg_{0.963}Cu_{0.007}Sb_{0.99}$, the Seebeck coefficient starts at about 234 $\mu V\ K^{-1}$ at room temperature, then increases to about 256 $\mu V\ K^{-1}$ before decreasing to about 207 $\mu V\ K^{-1}$ at 275° C., which is lower than that of $MgAg_{0.97}Sb_{0.99}$ in the entire temperature range.

Figure 19D:
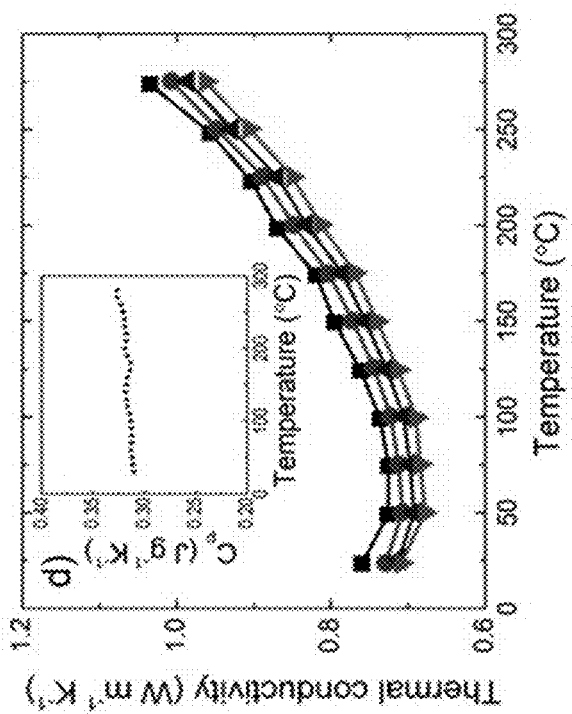
Figure 19C:
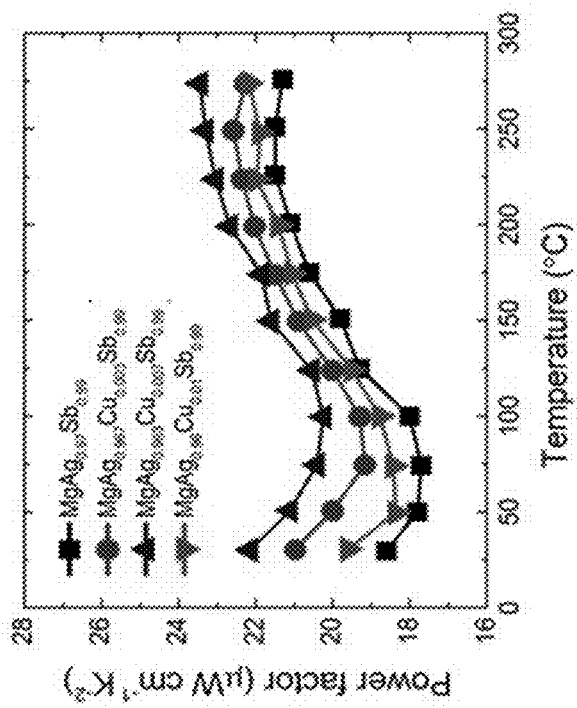

FIG. 19C is a graph of power factor ($PF=S^2\sigma$) calculated from the measured electrical conductivity and Seebeck coefficient for the $MgAg_{0.97-x}Cu_xSb_{0.99}$ samples. The power factors of all the samples first decrease and then increase, and finally saturate (a little decrease in case of x=0.003 and 0.01) with temperature up to 275° C. The increased power factor after Seebeck coefficient peak should be ascribed to the enhanced electronic conductivity. The Cu substituted samples have higher power factors than $MgAg_{0.97}Sb_{0.99}$. Especially, for $MgAg_{0.963}Cu_{0.007}Sb_{0.99}$, the power factor is about 22 $\mu W\ cm^{-1}\ K^{-2}$ at room temperature, then decreases to about 20 $\mu W\ cm^{-1}\ K^{-2}$ before increasing to about 23 $\mu W\ cm^{-1}\ K^{-2}$ at 275° C., which is higher than that of $MgAg_{0.97}Sb_{0.99}$ in the entire temperature range.

FIG. 19D is a graph that illustrates the total thermal conductivity as a function of temperature for the $MgAg_{0.97-x}Cu_xSb_{0.99}$ samples. The densities of the samples measured by the Archimedes method are in the range of 6.18 to 6.20 g cm$^{-3}$, which is 98% of the theoretical density 6.31 g cm$^{-3}$. In a conservative way, the specific heat ($C_p$) of $MgAg_{0.97}Sb_{0.99}$ (shown in the inset of FIG. 19D) is used for the calculation of the total thermal conductivity of all the Cu substituted samples. The total thermal conductivity of all samples first decreases and then increases with temperature. The increase of thermal conductivity may be due to the bipolar effect, which is consistent with the temperature dependence of electrical resistivity and Seebeck coefficient shown in FIGS. 19A and 19B.

For the $MgAg_{0.97}Sb_{0.99}$ sample, the $\kappa_{total}$ values are much lower than that of the high performance thermoelectric materials such as PbTe, skutterudites, and are even lower than that of the nanostructured $Bi_{0.4}Sb_{1.6}Te_3$. For the Cu substituted samples, the thermal conductivity is lower than that of $MgAg_{0.97}Sb_{0.99}$, and decreases with the increase of Cu content. Even though the electrical conductivity of the Cu substituted samples is higher than that of the $MgAg_{0.97}Sb_{0.99}$ sample (FIG. 19A), which may indicate that electronic thermal conductivity of the Cu substituted samples is higher than that of $MgAg_{0.97}Sb_{0.99}$, the total thermal conductivity of the Cu substituted samples is rather lower, indicating the fact that Cu is very effective on reducing the lattice thermal conductivity since the electronic thermal conductivity is $\kappa_{ele}=L\sigma T$, where L is Lorenz number. It is well known that the total thermal conductivity comprises three parts, including lattice thermal conductivity, electronic thermal conductivity, and bipolar thermal conductivity ($\kappa_{total}=\kappa_{latt}+\kappa_{ele}+\kappa_{bipol}$). For MgAgSb-based sample, the intrinsic excitation occurs after 100° C. In order to clarify the effect of Cu substitution on the $\kappa_{latt}$, the $\kappa_{latt}$ is calculated from $\kappa_{latt}=\kappa_{total}-\kappa_{ele}$ before the occurrence of intrinsic excitation. Here the $\kappa_{ele}$ is calculated by the Wiedemann-Franz relation, $\kappa_{ele}=L\sigma T$. For free electrons, L=2.45×10$^{-8}$ V$^2$ K$^{-2}$.

Figure 19E:
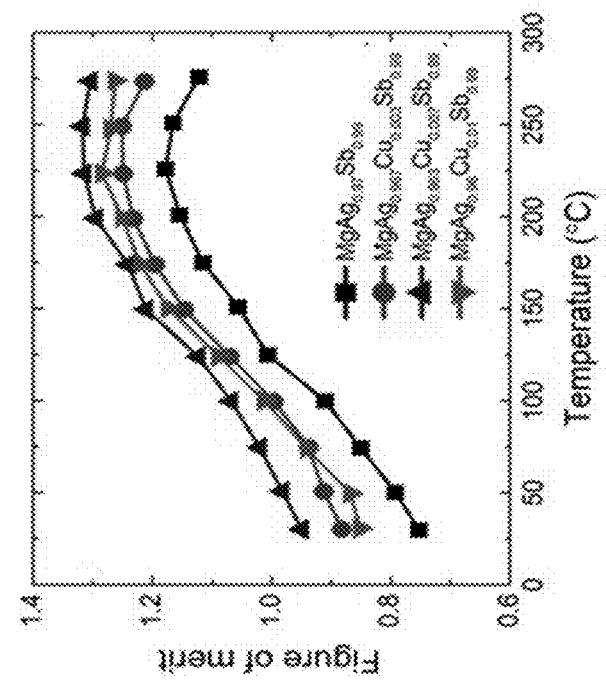

FIG. 19E illustrates that the $\kappa_{latt}$ decreases due to the Cu substitution. Namely, the $\kappa_{latt}$ decreases from 0.62 for $MgAg_{0.97}Sb_{0.99}$ to 0.51 for $MgAg_{0.983}Cu_{0.007}Sb_{0.99}$ at room temperature. The reduction in the lattice thermal conductivity of Cu substituted $MgAg_{0.97-x}Cu_xSb_{0.99}$ sample can be explained by the point defects on the basis of the Callaway model, in which the point defect scattering in a solid solution system originates from both the mass difference (Cu 63.55, Ag 107.87) and the interatomic coupling force differences derived from the size difference of $Ag^{+1}$(1.26 Å) and $Cu^{+1}$ (0.73 Å). It should be noted that the total thermal conductivity of the $MgAg_{0.96}Cu_{0.01}Sb_{0.99}$ sample is further decreased, but the lattice thermal conductivity is little increased. The reduced total thermal conductivity may be due to the decreased electronic thermal conductivity.

Figure 19F:
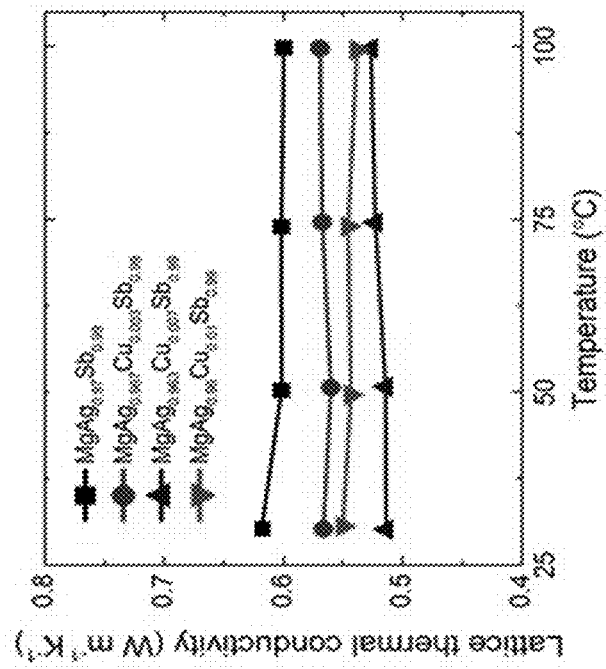

FIG. 19F is a graph that illustrates the ZT values of the $MgAg_{0.97-x}Cu_xSb_{0.99}$ samples fabricated according to certain embodiments of the present disclosure. Compared with the $MgAg_{0.97}Sb_{0.99}$ sample, the decreased thermal conductivity and the improved power factor lead to higher peak and average ZT values in the Cu substituted samples. Subsequently, ZTs of 0.95 at room temperature and 1.32 at 250° C. were observed in sample $MgAg_{0.963}Cu_{0.007}Ag_{0.99}$.

Figure 20:
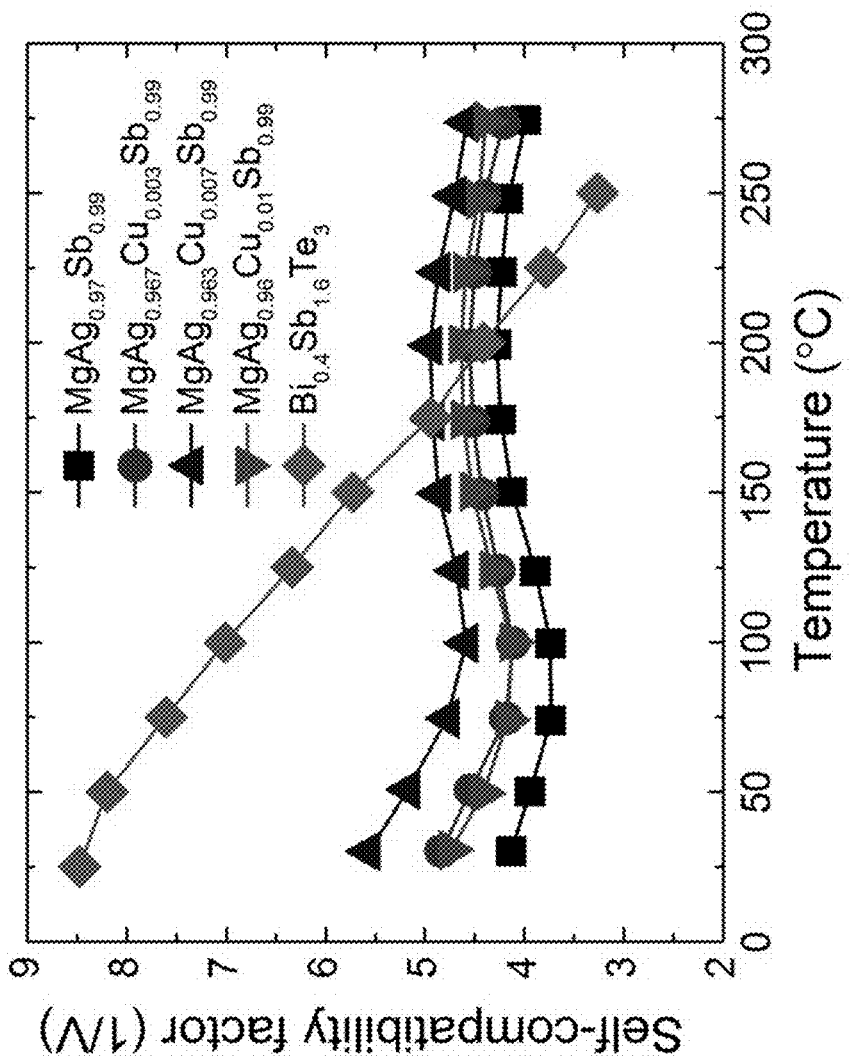
FIG. 20 is a graph that illustrates the self-compatibility factors of $MgAg_{0.97-x}Cu_xSb_{0.99}$ materials fabricated according to certain embodiments of the present disclosure.

FIG. 20 is a graph that illustrates the self-compatibility factors of $MgAg_{0.97-x}Cu_xSb_{0.99}$ materials fabricated according to certain embodiments of the present disclosure. The self-compatibility factor ($c=(\sqrt{1+ZT}-1)/(ST)$) is relevant for thermoelectric generators because the thermoelectric material properties may change dramatically from the hot side to the cold side. If the self-compatibility factors differ by a factor of two or more, the thermoelectric materials will not be efficient. For comparison, the self-compatibility factor of nanostructured $Bi_{0.4}Sb_{1.6}Te_3$ is also plotted. The ZT value and Seebeck coefficient of $Bi_{0.4}Sb_{1.6}Te_3$ are used to calculate the self-compatibility factor of $Bi_{0.4}Sb_{1.6}Te_3$. For the $MgAg_{0.97-x}Cu_xSb_{0.99}$ samples, the self-compatibility factor varies by less than 20%, while that of $Bi_{0.4}Sb_{1.6}Te_3$ is almost 3 in the whole temperature range, which means higher conversion efficiency of $MgAg_{0.97-x}Cu_xSb_{0.99}$ than $Bi_{0.4}Sb_{1.6}Te_3$ is possible.

Figure 21:
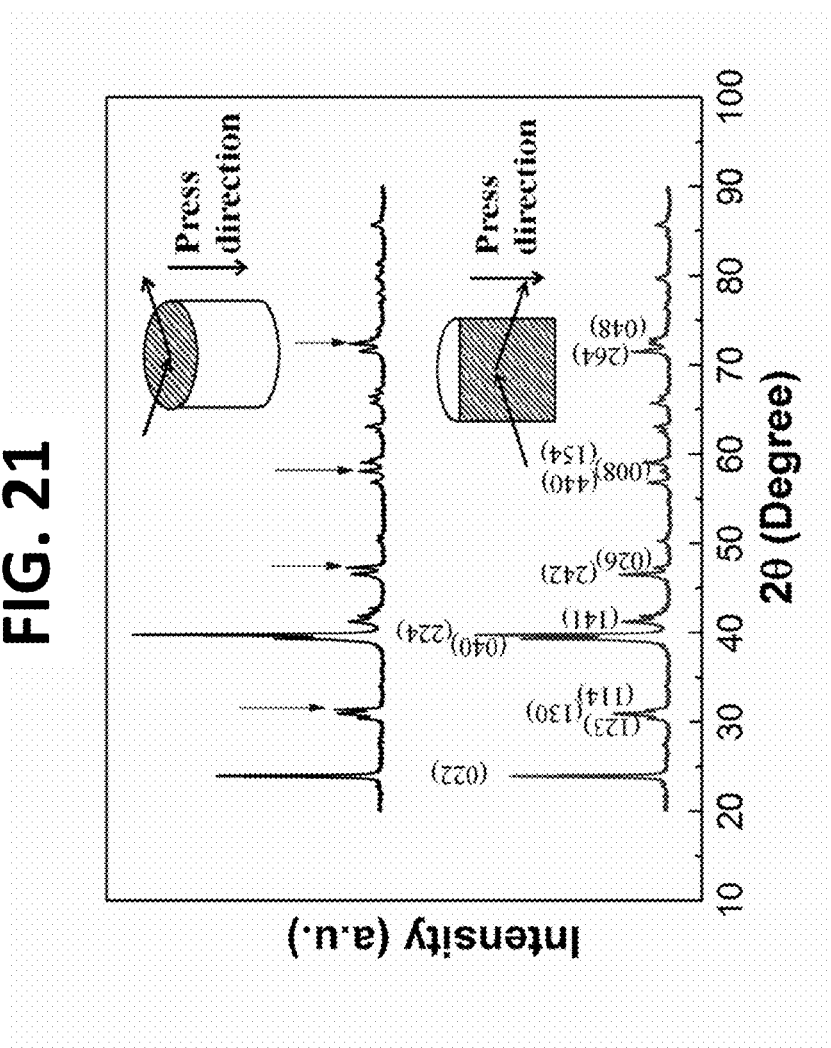
FIG. 21 is a graph of the X-ray diffraction (XRD) patterns of both the planes perpendicular and parallel to the press direction

In order to investigate the anisotropy of the thermoelectric properties, thick $MgAg_{0.97}Sb_{0.99}$ samples were prepared. FIG. 21 is a graph of the X-ray diffraction (XRD) patterns of both the planes perpendicular and parallel to the press direction, respectively. These two XRD spectra look like very similar except some differences in the intensity of a few typical peaks marked by arrows in FIG. 21, indicating that there is a little grain orientation anisotropy. This is reflected on the physical properties (discussed below).

Figure 22A:
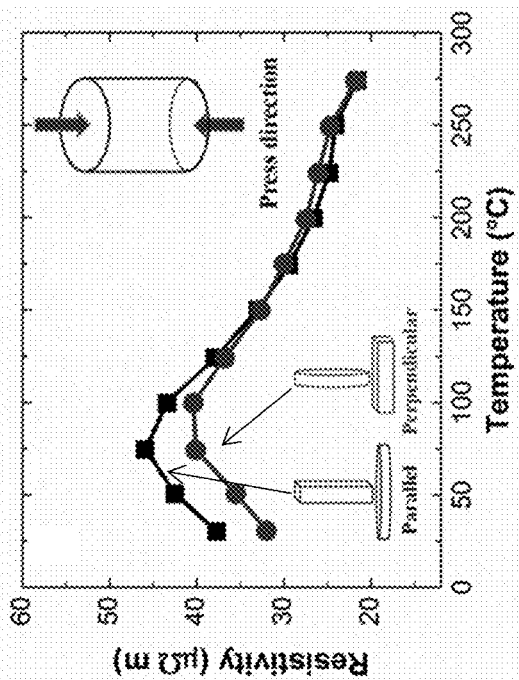
FIGS. 22A-22E are graphs illustrating the temperature dependence of thermoelectric properties for the as-pressed samples fabricated according to certain embodiments of the present disclosure in both the directions perpendicular (⊥) and parallel (//) to the press direction.
Figure 22B:
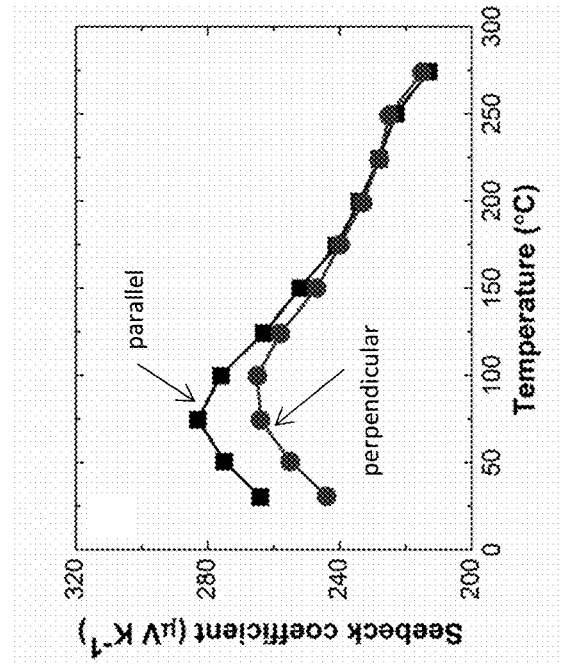

FIGS. 22A-22E are graphs illustrating the temperature dependence of thermoelectric properties for the as-pressed samples in both the directions perpendicular ($\perp$) and parallel (//) to the press direction. FIG. 22A is a graph illustrating that electrical resistivity ($\rho_{//}$) of the parallel direction is higher than that ($\rho_\perp$) of the perpendicular direction below 150° C., which indicates that there is grain orientation, consistent with the results shown by XRD (FIG. 21). After 150° C., the electrical resistivity of both directions is substantially similar. The Seebeck coefficients of the as-pressed sample display similar trend with the electrical resistivity as shown in FIG. 22B. Based on the electrical resistivity and Seebeck coefficient, the corresponding power factors of the as-pressed samples in both directions are very similar and shown in FIG. 22C.

Figure 22D:
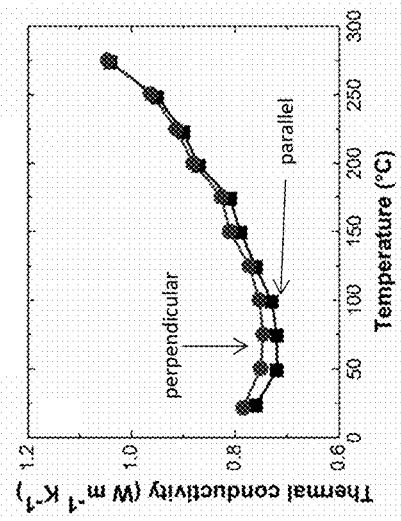
Figure 22C:
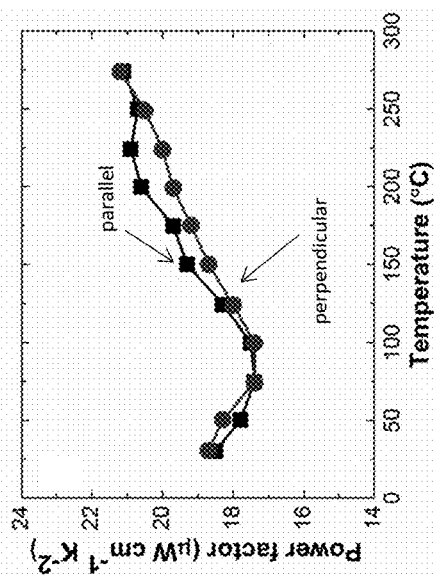
Figure 22E:
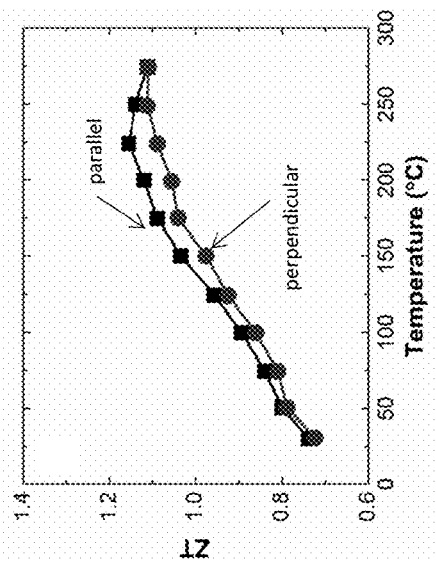

FIG. 22D is a graph illustrating the thermal conductivity of the as-pressed $MgAg_{0.97}Sb_{0.99}$ sample in both the parallel and perpendicular directions. FIG. 22E illustrates the ZT dependence of temperature for $MgAg_{0.97}Sb_{0.99}$ in both the parallel and perpendicular directions. The ZTs in both the parallel and perpendicular directions are basically the same within the experimental errors of ZTs of about 10-12%.

In an embodiment, Cu-substituted $MgAg_{0.97-x}Cu_xSb_{0.99}$ materials were made through a two-step ball milling and hot pressing method by avoiding the phase transition. The Cu substitution of Ag in $MgAg_{0.97-x}Cu_xSb_{0.99}$ samples improved the power factor and also decreased thermal conductivity. The ZT value at room temperature is close to 1 and increases with temperature to a maximum of about 1.32 at 250° C. for $MgAg_{0.963}Cu_{0.007}Sb_{0.99}$. Meanwhile, the self-compatibility factors of the $MgAg_{0.97-x}Cu_xSb_{0.99}$ samples are much less temperature dependent than $Bi_{0.4}Sb_{1.6}Te_3$, displaying potential for higher thermal energy to electricity conversion efficiency. Study on the thermoelectric properties along the parallel and perpendicular to hot press direction shows that $MgAg_{0.97}Sb_{0.99}$ has little anisotropy. This tellurium-free thermoelectric material is a potential candidate to replace $Bi_2Te_3$-based materials now used for cooling and waste heat recovery applications at lower than 300° C.

Exemplary embodiments are disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed is:

1. A thermoelectric material comprising:
a thermoelectric material according to the composition $Mg_{1-x}Na_xAg_{0.97}Sb_{0.99}$, and comprising a ZT of about 0.90 to about 1.3 from about 100° C. to about 275° C., wherein x is from about to 0.005 about 0.01.

2. The thermoelectric material of claim 1, wherein a Seebeck coefficient of the thermoelectric material is from about 230 $\mu VK^{-1}$ to less than 260 $\mu VK^{-1}$ from 50° C. to about 150° C.

3. The thermoelectric material of claim 2, wherein an electrical resistivity of the thermoelectric material is from more than 15 $\mu\Omega*m$ to less than 25 $\mu\Omega*m$ from about 175° C. to about 275° C.

4. The thermoelectric material of claim 1, wherein the thermoelectric material is a pure phase material.

5. A thermoelectric material comprising:
a thermoelectric material according to the composition $Mg_{1-x}Na_xAg_{0.97}Sb_{0.99}$,
wherein x is from about to 0.005 about 0.01, wherein a plurality of grains of the thermoelectric material are from 5 nm to 200 nm in diameter, and wherein the thermoelectric material comprises a ZT of about 0.90 to about 1.3 from about 100° C. to about 275° C.

6. The theremoelectric material of claim 5, wherein a Seebeck coefficient of the thermoelectric material is from about 230 $\mu VK^{-1}$ to less than 260 $\mu VK^{-1}$ from 50° C. to about 150° C.

7. The theremoelectric material of claim 5, wherein a power factor of the thermoelectric material is from more than 21 $\mu Wcm^{-1}K^{-2}$ to less than 23 $\mu Wcm^{-1}K^{-2}$ from about 175° C. to about 275° C.

* * * * *